United States Patent
Kang et al.

(10) Patent No.: US 11,387,817 B2
(45) Date of Patent: Jul. 12, 2022

(54) LATCH CIRCUIT, FLIP-FLOP CIRCUIT INCLUDING THE SAME

(71) Applicant: SAMSUNG ELECTRONICS CO., LTD., Suwon-si (KR)

(72) Inventors: Byoung Gon Kang, Seoul (KR); Woo Kyu Kim, Daegu (KR); Tae Jun Yoo, Hwaseong-si (KR); Dal Hee Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/215,838

(22) Filed: Mar. 29, 2021

(65) Prior Publication Data

US 2021/0328582 A1    Oct. 21, 2021

(30) Foreign Application Priority Data

Apr. 16, 2020 (KR) .................. 10-2020-0045919
Dec. 11, 2020 (KR) .................. 10-2020-0173642

(51) Int. Cl.
| | | |
|---|---|---|
| *H03K 3/037* | (2006.01) | |
| *H03K 19/20* | (2006.01) | |
| *H03K 3/012* | (2006.01) | |
| *H03K 3/3562* | (2006.01) | |

(52) U.S. Cl.
CPC .......... *H03K 3/0372* (2013.01); *H03K 3/012* (2013.01); *H03K 3/3562* (2013.01); *H03K 19/20* (2013.01)

(58) Field of Classification Search
CPC combination set(s) only.
See application file for complete search history.

(56) References Cited

U.S. PATENT DOCUMENTS

| | | |
|---|---|---|
| 6,297,668 B1 | 10/2001 | Schober |
| 6,333,656 B1 | 12/2001 | Schober |
| 7,154,319 B2 | 12/2006 | Kim |
| 9,742,382 B2 | 8/2017 | Cai et al. |
| 9,915,933 B2 | 3/2018 | Kim |
| 9,985,612 B2 | 5/2018 | Agarwal et al. |
| 9,985,613 B2 | 5/2018 | Savanth et al. |
| 10,340,897 B2 * | 7/2019 | Yang ............ H03K 3/037 |
| 10,382,020 B2 | 8/2019 | Nandi et al. |
| 10,608,615 B2 | 3/2020 | Kim et al. |
| 11,190,186 B2 * | 11/2021 | Lee ............. H03K 3/012 |
| 2021/0135659 A1 | 5/2021 | Lee et al. |

FOREIGN PATENT DOCUMENTS

KR    10-2024470 B1    9/2019

* cited by examiner

*Primary Examiner* — Long Nguyen
(74) *Attorney, Agent, or Firm* — Sughrue Mion, PLLC

(57) ABSTRACT

A master latch circuit, including a first p-type transistor, a first n-type transistor, and a second n-type transistor connected in series; a first node connected to the first p-type transistor and the first n-type transistor, and a NAND circuit configured to receive a signal of the first node and a clock signal and output a result of a NAND operation to a second node, wherein a gate of the first p-type transistor is connected to the second node.

16 Claims, 19 Drawing Sheets

LATCH CIRCUIT, FLIP-FLOP CIRCUIT INCLUDING THE SAME

This application is based on and claims priority from Korean Patent Application No. 10-2020-0045919 filed on Apr. 16, 2020 and Korean Patent Application No. 10-2020-0173642 filed on Dec. 11, 2020 in the Korean Intellectual Property Office, the disclosures of which are incorporated herein by reference in their entireties.

BACKGROUND

1. Field

The disclosure relates to a latch circuit and a flip-flop circuit including the same.

2. Description of Related Art

Flip-flops are general-purpose data storage elements used in digital electronic circuits. The flip-flops are important components in the design of digital circuits. This is because the flip-flops are clocked storage elements that enable a sequential and stable logic design. The flip-flops are used to store logic states, parameters, or digital control signals.

For example, microprocessors may typically include a plurality of flip-flops, and in order to meet the high-performance microprocessor operation, the flip-flops are required to provide a maximum logic clocking speed by reducing a flip-flop setup & hold time and a clock-to-output time. In addition, the flip-flops are also required to reduce power consumed unnecessarily when the flip-flops are not operated, for example, power consumed in a clock buffer.

SUMMARY

Provided are a latch circuit and a flip-flop circuit including the same, which operate by internally generating an inverted clock signal even without a clock buffer, and a semiconductor device.

Also provided are a latch circuit and a flip-flop circuit including the same, which have improved power efficiency by reducing power consumed by a clock buffer when a flip-flop is not operated, and a semiconductor device.

It should be noted that objects of the present disclosure are not limited thereto and other objects of the present disclosure will be apparent to those skilled in the art from the following descriptions.

In accordance with an aspect of the disclosure, a master latch circuit includes a first p-type transistor, a first n-type transistor, and a second n-type transistor connected in series between a power supply terminal and a power ground terminal; a first node connected to a drain terminal of the first p-type transistor and a drain terminal of the first n-type transistor; and a NAND circuit configured to receive a signal of the first node and a clock signal, perform a NAND operation, and output a result of the NAND operation to a second node, wherein the NAND circuit includes a second p-type transistor connected in parallel with a third p-type transistor between the power supply terminal and the second node, and a third n-type transistor connected in series with a fourth n-type transistor between the second node and the power ground terminal, wherein a gate of the second p-type transistor and a gate of the fourth n-type transistor are connected to the first node, wherein a gate of the first n-type transistor, a gate of the third p-type transistor, and a gate of the third n-type transistor are configured to receive the clock signal, and wherein a gate of the first p-type transistor is connected to the second node.

In accordance with an aspect of the disclosure, a master latch circuit includes a first p-type transistor, a second p-type transistor, and a first n-type transistor connected in series between a power supply terminal and a power ground terminal; a first node connected to the second p-type transistor and the first n-type transistor; and a NOR circuit configured to receive a signal of the first node and an inverted clock signal, perform a NOR operation, and output a result of the NOR operation to a second node, wherein the NOR circuit includes a third p-type transistor connected in series with a fourth p-type transistor between the power supply terminal and the second node, a third node connected to the third p-type transistor and the fourth P-type transistor, and a second n-type transistor connected in parallel with a third n-type transistor between the second node and the power ground terminal, wherein a gate of the third p-type transistor and a gate of the second n-type transistor are connected to the first node, wherein a gate of the third n-type transistor, a gate of the fourth p-type transistor, and a gate of the second p-type transistor are configured to receive the inverted clock signal, and wherein a gate of the first n-type transistor is connected to the second node.

In accordance with an aspect of the disclosure, a flip-flop circuit includes a scan multiplexer (MUX) circuit having a MUX output terminal connected to a first node; a first latch circuit connected between the first node and a second node; a second latch circuit connected between the second node and a third node; and an output driving circuit configured to drive and output a signal of the third node, wherein the first latch circuit includes a first p-type transistor, a first n-type transistor, and a second n-type transistor connected in series between a power supply terminal and a power ground terminal, and a NAND circuit configured to receive a signal of the first node and a clock signal, and perform a NAND operation and output a result of the NAND operation to the second node, wherein the NAND circuit includes a second p-type transistor connected in parallel with a third p-type transistor between the power supply terminal and the second node, and a third n-type transistor connected in series with a fourth n-type transistor between the second node and the power ground terminal, wherein a drain terminal of the first p-type transistor and a drain terminal of the first n-type transistor are connected to the first node, wherein a gate of the second p-type transistor and a gate of the fourth n-type transistor are connected to the first node, wherein a gate of the first n-type transistor, a gate of the third p-type transistor, and a gate of the third n-type transistor are configured to receive the clock signal, wherein the first n-type transistor and the second n-type transistor are not simultaneously turned on, and wherein a gate of the first p-type transistor is connected to the second node.

In accordance with an aspect of the disclosure, a multi-bit flip-flop circuit includes a scan inverter circuit configured to invert a scan enable signal to generate an inverted scan enable signal; a clock buffer circuit configured to generate an inverted clock signal from a clock signal; a plurality of first flip-flop circuits electrically connected to the scan inverter circuit or the clock buffer circuit and arranged adjacently in a first direction; and a plurality of second flip-flop circuits, which are electrically connected to the clock buffer circuit and the scan inverter circuit and arranged adjacently in the first direction and adjacently to the plurality of first flip-flop circuits in a second direction, wherein each flip-flop circuit of the plurality of first flip-flop circuits and the plurality of second flip-flop circuits includes a first power input line, a second power input line, and a third power input line spaced apart in the first direction, a first row including a scan multiplexer (MUX) circuit, an output driver circuit, and a first inverter circuit disposed between the first power input line and the second power input line, and a second row including a first latch circuit and an AND/OR/Inverter (AOI) circuit disposed between the second power input line and the third power input line, wherein the first latch circuit includes a first p-type transistor, a second p-type transistor, and a first n-type transistor connected in series between a first power supply terminal connected to the third power input line and a first power ground terminal connected to the second power input line, a first node connected to a drain terminal of the second p-type transistor, a drain terminal of the first n-type transistor, and an output terminal of the scan MUX circuit, and first NOR circuit configured to receive a signal of the first node and the inverted clock signal, perform a first NOR operation, and output a result of the first NOR operation to a second node, wherein the first NOR circuit includes a third p-type transistor connected in series with a fourth p-type transistor between the first power supply terminal and the second node, connected in parallel with a second n-type transistor and a third n-type transistor between the second node and the first power ground terminal, wherein a gate of the third p-type transistor and a gate of the second n-type transistor are connected to the first node, wherein a gate of the third n-type transistor, the fourth p-type transistor, and the second p-type transistor are configured to receive the inverted clock signal, and wherein a gate of the first n-type transistor is connected to the second node.

Other details of exemplary embodiments for solving the above problems are included in the detailed description and the drawings.

BRIEF DESCRIPTION OF THE DRAWINGS

The above and other aspects, features, and advantages of the present disclosure will be more apparent from the following description taken in conjunction with the accompanying drawings, in which.

DETAILED DESCRIPTION OF THE EMBODIMENTS

It should be understood that, although terms such as "first," "second," and the like may be used herein to describe various elements or components, these elements or components are not limited by these terms. These terms are only used to distinguish one element or component from another element or component. Therefore, a first element or component described below could be termed a second element or component without departing from the scope and spirit of the present disclosure.

In the present specification, a common node refers to a point at which one terminal of each of at least two transistors or other elements is connected. For example, a common node of a first transistor and a second transistor may refer to a point at which a source or drain terminal of the first transistor is connected to a drain or source terminal of the second transistor.

Hereinafter, various exemplary embodiments of the present disclosure will be described with reference to the accompanying drawings.

Figure 1:
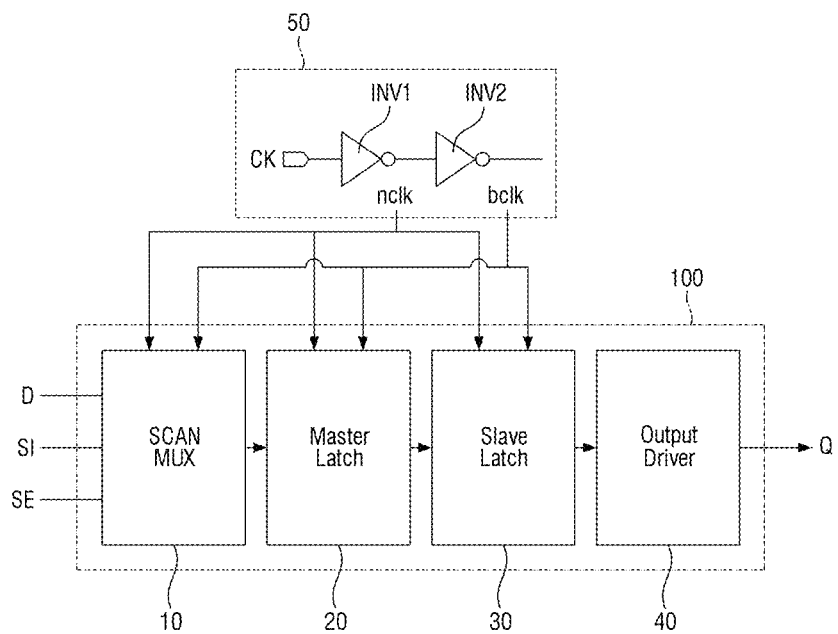
FIG. 1 is a block diagram illustrating a flip-flop circuit according to an embodiment.
Figure 2:
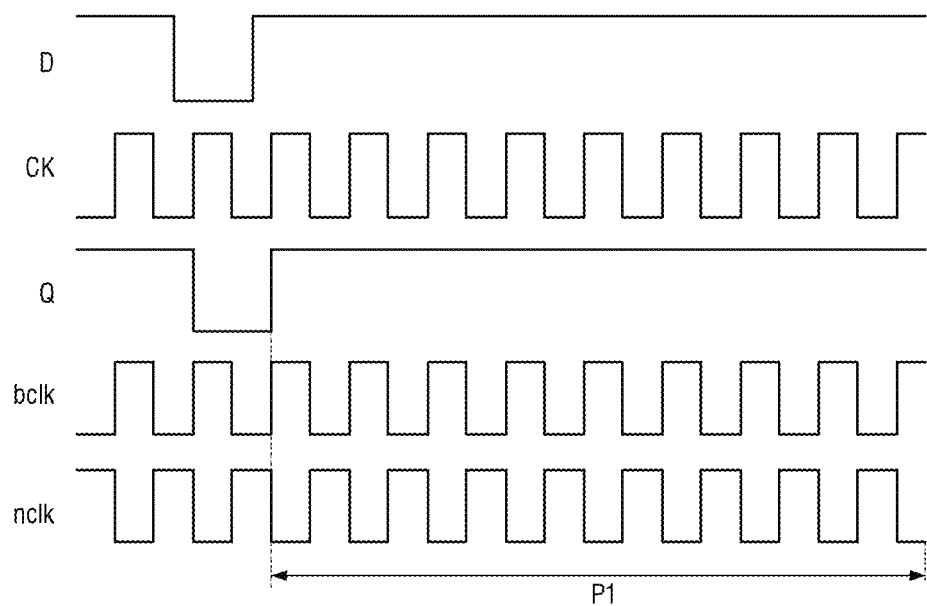
FIG. 2 is a timing diagram illustrating an operation of the flip-flop circuit of FIG. 1 according to an embodiment.

FIG. 1 is a block diagram illustrating a flip-flop circuit, and FIG. 2 is a timing diagram illustrating an operation of the flip-flop circuit of FIG. 1.

Referring to FIG. 1, a flip-flop circuit 100 according to some exemplary embodiments may include a scan multiplexer (MUX) circuit 10, which may be referred to as a scan multiplexer, first latch circuit 20, second latch circuit 30, clock buffer INV1, clock buffer INV2, and an output driver circuit 40.

The scan MUX circuit 10 receives a data signal D or a scan input signal SI for a scan operation for a semiconductor circuit (not shown) and outputs one of the data signal D and the scan input signal SI according to a clock signal.

To this end, when a scan enable signal SE is at a logic high level and an inverted scan enable signal SEN is at a logic low level, the scan MUX circuit 10 inverts the scan input signal SI and outputs the inverted scan input signal SI to the first latch circuit 20. On the other hand, when the scan enable signal SE is at a logic low level (L) and the inverted scan enable signal SEN is at a logic high level (H), the scan MUX circuit 10 inverts the data signal D and outputs the inverted data signal D to the first latch circuit 20.

Meanwhile, the clock buffers INV1 and INV2 receive a clock signal CK and output an inverted clock signal nclk and a re-inverted clock signal bclk. The inverted clock signal nclk is generated by inverting the clock signal CK, and the re-inverted clock signal bclk is generated by re-inverting the inverted clock signal nclk. The inverted clock signal nclk and the re-inverted clock signal bclk are provided to the first latch circuit 20 and second latch circuit 30. For convenience of description, because the re-inverted clock signal bclk has the same phase as the clock signal CK, the re-inverted clock signal bclk will be referred to hereinafter as a clock signal bclk.

A first latch circuit 20 latches an output signal of the scan MUX circuit 10 and transmits the latched signal to a second latch circuit 30 on the basis of the clock signal bclk and the inverted clock signal nclk. The second latch circuit 30 latches an output signal of the first latch circuit 20 and transmits the latched signal to the output driver circuit 40 on the basis of the clock signal bclk and the inverted clock signal nclk.

That is, the first latch circuit 20 may act as a master latch that latches the output signal of the scan MUX circuit 10 and transmits the latched signal to the second latch circuit 30 at a rising edge of the clock signal bclk, and the second latch circuit 30 may act as a slave latch that latches the output signal of the first latch circuit 20 and transmits the latched signal to the output driver circuit 40 at the rising edge of the clock signal bclk.

The output driver circuit 40 receives the output signal of the second latch circuit 30 and outputs data Q as an output signal to the outside, for example an element outside of flip-flop circuit 100.

Referring to FIGS. 1 and 2, when the clock buffers INV1 and INV2 are used in the flip-flop circuit 100, whenever the input clock signal CK transitions between logic states, the clock signal bclk and the inverted clock signal nclk also transition between logic states. Here, when the data signal D, which is an input signal of the flip-flop circuit 100, is fixed to a logic high level and the flip-flop circuit 100 does not operate (period P1), unintended power consumption may occur due to the transition of the clock signal bclk and the inverted clock signal nclk.

Accordingly, it is necessary to reduce power consumption by enabling the flip-flop circuit 100 to operate without the clock buffers INV1 and INV2.

Figure 3:
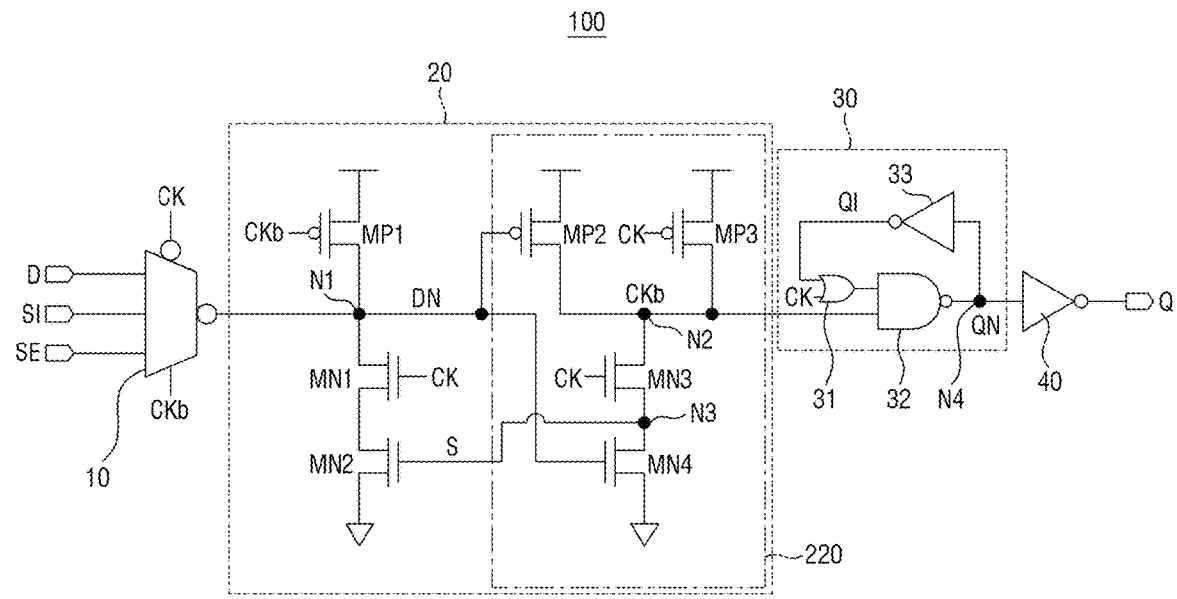
FIG. 3 is a circuit diagram illustrating a flip-flop circuit according to an embodiment.

FIG. 3 is a circuit diagram illustrating a flip-flop circuit according to some exemplary embodiments.

Referring to FIG. 3, a flip-flop circuit 100 may include a scan MUX circuit 10, first latch circuit 20, second latch circuit 30, and an output driver circuit 40.

The scan MUX circuit 10 includes a plurality of p-type transistors and a plurality of n-type transistors connected between a power supply terminal and a power ground (VSS) terminal. The scan MUX circuit 10 keeps the data signal D and provides the data signal D to a node N1 according to the scan enable signal SE, the clock signal CK, and the scan input signal SI. Here, the scan MUX circuit 10 inverts the data signal D and outputs the inverted signal to the node N1.

A first latch circuit 20 includes a plurality of p-type transistors and a plurality of n-type transistors connected between the power supply terminal and the VSS terminal. According to some exemplary embodiments, the first latch circuit 20 may include a transistor MP1 connected between the power supply terminal and the node N1, a transistor MN1 and a transistor MN2 connected in series between the node N1 and the VSS terminal, and a NAND circuit 220. According to some exemplary embodiments, the first latch circuit 20 may include the transistor MP1, the transistor MN1, the transistor MN2, and the NAND circuit 220 connected in series between the power supply terminal and the VSS terminal.

A gate of the transistor MP1 is connected to the node N2, the clock signal CK is supplied to a gate of the transistor MN1, and the gate of the transistor MN1 is connected to a node N3. The transistor MP1, the transistor MN1, and the transistor MN2 receive an output signal of the scan MUX circuit 10 and store the output signal at the node N1 according to the clock signal CK, a clock buffer signal CKb, and a signal S.

The NAND circuit 220 may include a transistor MP2 and a transistor MP3 connected in parallel between the power supply terminal and a node N2, and a transistor MN3 and a transistor MN4 connected in series between the node N2 and the VSS terminal. The transistor MN3 is connected between the node N2 and the node N3, and the transistor MN4 is connected between the node N3 and the VSS terminal. A gate of each of the transistor MP2 and the transistor MN4 is connected to the node N1, and the clock signal CK may be supplied to a gate of each of the transistor MP3 and the transistor MN3.

The NAND circuit 220 performs a NAND operation on an input signal DN of the node N1 and the clock signal CK and outputs the operation result to the node N2. More specifically, in the NAND circuit 220, when the clock signal CK is at a logic high level (H), the node N2 may be at a logic low level (L) on the basis of the transition of the signal DN of the node N1 (the node N1 transitions from a logic high level (H) to a logic low level (L)), or when the clock signal CK is at a logic low level (L), the node N2 may be at a logic high level (H) on the basis of the transition of the signal DN of the node N1 (the node N1 transitions from a logic low level (L) to a logic high level (H)). In other words, the NAND circuit 220 may operate to invert the clock signal CK on the basis of the signal DN of the node N1, and the clock buffer signal CKb may be provided by connecting the node N2 to each terminal requiring the inverted clock signal nclk during operation.

Meanwhile, the first latch circuit 20 may include a feedback path. The feedback path may include a path S through which the gate of the transistor MN2 is connected to the node N3. Whether the output signal of the scan MUX circuit 10 is stored in the node N1 is determined on the basis of a signal of the node N3 in addition to the clock signal CK and the clock buffer signal CKb.

Figure 4:
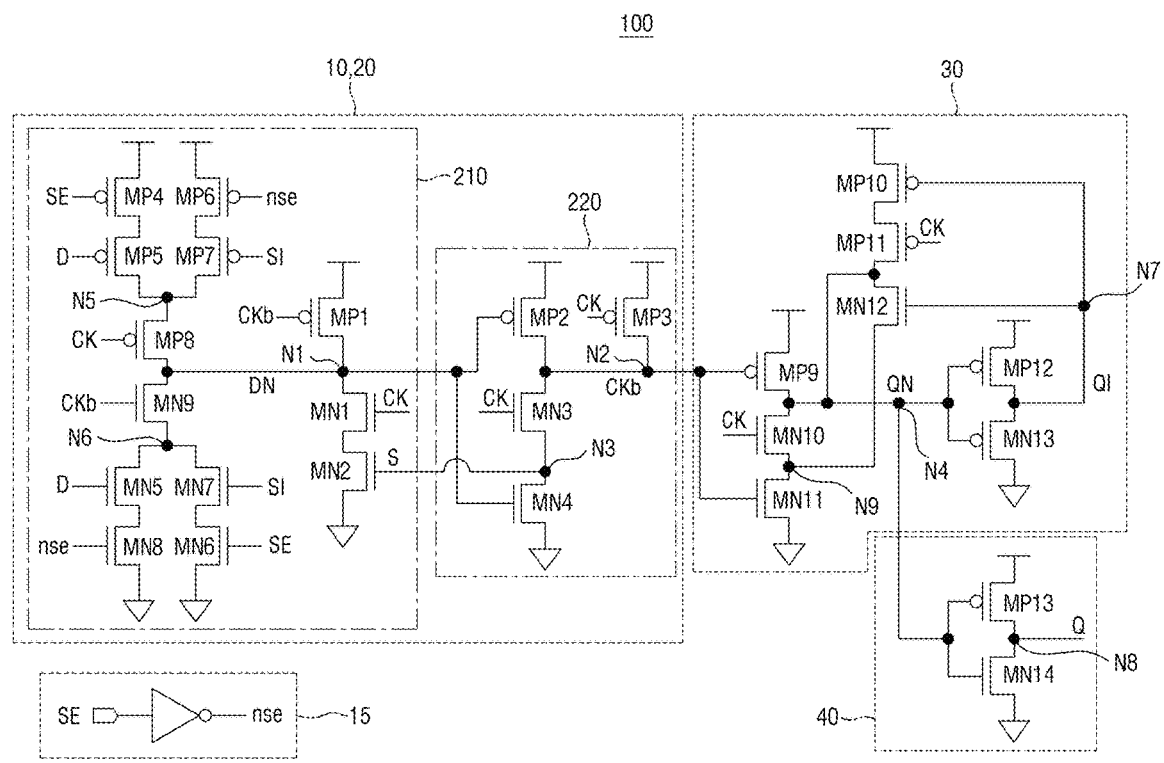
FIG. 4 is a circuit diagram illustrating a flip-flop circuit according to an embodiment.

Although a clock buffer circuit 50 is required to generate the inverted clock signal as described above with reference to FIGS. 1 and 2, in the present disclosure, the clock buffer is not required by generating the clock buffer signal CKb at the node N2 from the clock signal CK without the clock buffer and connecting the node N2 to the elements where the inverted clock signal is required, as shown for example in FIGS. 3 and 4, and accordingly, power due to toggling may not be consumed even in the period P1 in which the flip-flop circuit does not operate.

The second latch circuit 30 includes a plurality of p-type transistors and a plurality of n-type transistors connected between the power supply terminal and the VSS terminal. According to some exemplary embodiments, the second latch circuit 30 may include an OR circuit 31 configured to receive the clock signal CK and a signal QI, a NAND circuit 32 configured to output a signal QN by receiving an output signal of the OR circuit and the signal of the node N2, and an inverter circuit 33 configured to invert the output signal QN of the NAND circuit 32 and feed back the inverted signal to an input terminal of the OR circuit 31. According to some exemplary embodiments, the second latch circuit 30 may be implemented as an OR/AND/Inverter (OAI) circuit, in which the OR circuit 31 and the NAND circuit 32 are combined, and the inverter circuit 33.

The output driver circuit 40 may drive the output signal QN of the second latch circuit 30 and output the driven signal as the output signal Q of the flip-flop circuit. According to some exemplary embodiments, the output driver circuit 40 may include at least one inverter circuit. In this case, the output driver circuit 40 may invert the signal QN and output the inverted signal as the signal Q.

When the operation of the flip-flop circuit 100 is described according to some exemplary embodiments, the scan MUX circuit 10 is activated by the clock signal CK and the scan enable signal SE but outputs the data signal D to the first latch circuit 20, which is the next stage, only when the scan input signal SI is input. At this point, according to various exemplary embodiments, the scan MUX circuit 10 may output the data signal D as it is or may invert the data signal D and output the inverted signal. The scan MUX circuit 10 of the exemplary embodiment shown in FIG. 3 inverts the data signal D and outputs the inverted signal to the node N1. The first latch circuit 20 keeps the signal input to the node N1, that is, the inverted data (DN), and inverts the signal of the node N1 and outputs the inverted signal to the node N2 by the operation of the NAND circuit 220 according to the transition of the clock signal CK. That is, the inverted data of the node N1 is output to the node N2 as a re-inverted data QI. When a signal is input to the node N2, the second latch circuit 30 re-inverts the signal of the node N2 using the OAI circuit including OR circuit 31 and NAND circuit 32 according to the transition of the clock signal CK and outputs the inverted signal QN to a node N4, and the output driver circuit 40 inverts the signal of the node N4 and outputs the inverted signal Q.

According to the above-described flip-flop circuit 100 of FIG. 3, the number of transistors may be reduced by using the clock buffer signal, which may be referred to as the node N2 or the clock buffer signal CKb, which is generated at the internal node of the first latch circuit 20 without the clock buffer circuit 50 shown in FIG. 1, instead of the inverted clock signal nclk generated by the clock buffer circuit 50 so that the area of the flip-flop circuit may be reduced. Further, it is possible to adjust operating frequencies of the flip-flop circuit 100 to be the same because the signal of the internal node may be used. In addition, power in the clock buffer circuit 50 that would be consumed to generate the inverted clock signal nclk may not be required.

Figure 5:
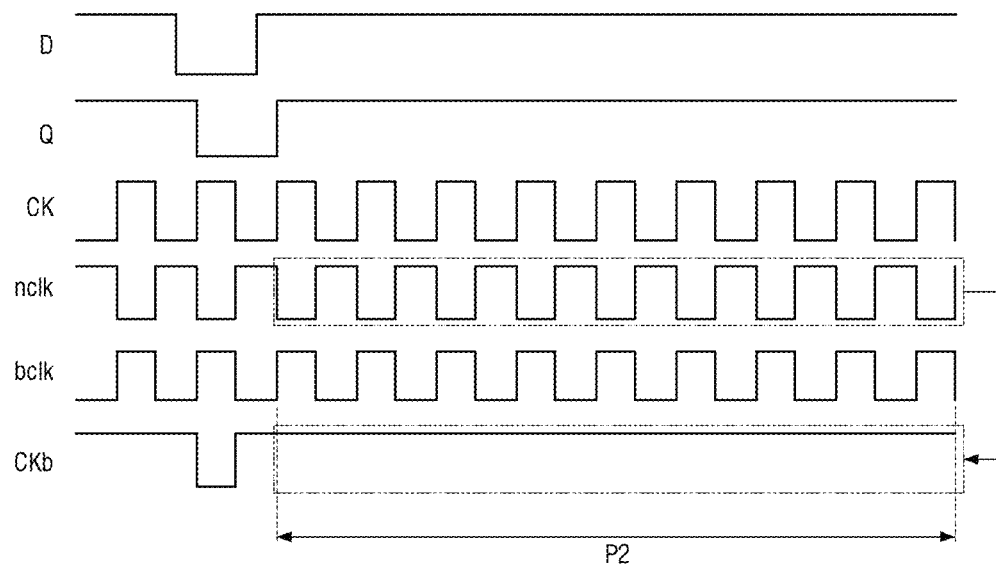
FIG. 5 is a timing diagram illustrating an operation of the flip-flop circuit of FIG. 3 according to an embodiment.

FIG. 4 is a circuit diagram of a flip-flop circuit according to some exemplary embodiments, and FIG. 5 is a timing diagram illustrating an operation of the flip-flop circuit of FIG. 3. For convenience of description, parts that are different from those of the exemplary embodiment of FIG. 3 will be mainly described. Parts that are not described will be the same as those described with reference to FIG. 3.

Referring to FIG. 4, a flip-flop circuit 100 may include a scan MUX circuit 10, a scan inverter circuit 15, first latch circuit 20, second latch circuit 30, and an output driver circuit 40. According to some exemplary embodiments, the scan MUX circuit 10 and a first latch circuit 20 may be implemented as a scan MUX circuit 210 and a NAND circuit 220.

The scan inverter circuit 15 includes an inverter circuit configured to receive the scan enable signal SE and generate an inverted scan enable signal nse.

Specifically, the scan MUX circuit 10 may include transistors MP4 to MP8 and transistors MN5 to MN9, and a feedback circuit of the first latch circuit may include a transistor MP1, a transistor MN1, and a transistor MN2.

The transistor MP4 and the transistor MP5, which are connected in series between the power supply terminal and a node N5, and the transistor MP6 and the transistor MP7, which are connected in series between the power supply terminal and the node N5, are connected in parallel.

The transistor MN5 and the transistor MN8, which are connected in series between the VSS terminal and a node N6, and the transistor MN6 and the transistor MN7, which are connected in series between the VSS terminal and the node N6, are connected in parallel.

A gate of each of the transistor MP4 and the transistor MN6 receives the scan enable signal SE, and a gate of each of the transistor MP6 and the transistor MN8 receives the inverted scan enable signal nse. A gate of each of the transistor MP5 and the transistor MN5 receives the data signal D, and a gate of each of the transistor MP7 and the transistor MN7 receives the scan input signal SI.

The transistor MP8 is connected between the node N5 and the node N1, and the transistor MN9 is connected between the node N6 and the node N1.

A gate of the transistor MP8 receives the clock signal CK, and a gate of the transistor MN9 is connected to a node N2 (clock buffer signal CKb). Meanwhile, the node N1 may be referred to herein as a common node connecting the transistor MN9 and the transistor MP8.

Meanwhile, the transistors MN1 and MP8, which are gated by the clock signal CK, and the transistors MP1 and MN9, which are gated by the clock buffer signal CKb, may be respectively configured as a CMOS circuit pair. The CMOS circuit pair operates as an input control circuit that controls the input of the data signal on the scan MUX circuit 10 side (the transistor MP8 and the transistor MN9), and keeps the data signal input through the scan MUX circuit 10 on a master latch circuit side (the transistor MP1 and the transistor MN1). That is, the transistors MP8 and MN9 may be referred to as data input control transistors, and the transistors MP1, MN1, and MN2 may be referred to as data keeper transistors.

According to some exemplary embodiments, a second latch circuit 30 may include an OAI circuit (for example OR circuit 31 and NAND circuit 32 of FIG. 3) and an inverter circuit (for example inverter circuit 33 of FIG. 3). More specifically, the second latch circuit 30 may include transistors MP9 to MP12 and transistors MN10 to MN13.

The transistor MP9, the transistor MN10, and the transistor MN11 may be connected in series between the power supply terminal and the VSS terminal. The transistor MP9 may be connected between the power supply terminal and a node N4, the transistor MN10 may be connected between the node N4 and a node N9, and the transistor MN11 may connected between the node N9 and the VSS terminal. A gate of each of the transistor MP9 and the transistor MN11 may be connected to the node N2 and receive the clock buffer signal CKb. The clock signal CK may be applied to a gate of the transistor MN10.

The transistor MP10, the transistor MP11, and the transistor MN12 may be connected in series between the power supply terminal and the node N9. The transistor MP10 and the transistor MP11 may be connected in series between the power supply terminal and the node N4, and the transistor MN12 may be connected between the node N4 and the node N9. A gate of each of the transistor MP10 and the transistor MN12 is connected to a node N7 and receives a signal QI. The clock signal CK is applied to a gate of the transistor MP11.

The transistor MP12 and the transistor MN13 may be connected in series between the power supply terminal and the VSS terminal. The transistor MP12 may be connected between the power supply terminal and the node N7. The transistor MN13 may be connected between the VSS terminal and the node N7. A gate of each of the transistor MP12 and the transistor MN13 is connected to the node N4 and receives a signal QN. The transistor MP12 and the transistor MN13 are the inverter circuit 33 and may invert the signal QN of the node N4 and output the inverted signal as the signal QI of the node N7.

The output driver circuit 40 may include a transistor MP13 and a transistor MN14 connected in series between the power supply terminal and the VSS terminal. The transistor MP13 may be connected between the power supply terminal and a node N8. The transistor MN14 may be connected between the VSS terminal and the node N8. A gate of each of the transistor MP13 and the transistor MN14 is connected to the node N4 and receives the signal QN. The transistor MP13 and the transistor MN14 are an inverter circuit included in output driver circuit 40 and may invert the signal QN of the node N4 and output the inverted signal as a signal Q of the node N8, that is, the output signal of the flip-flop circuit 100.

According to some exemplary embodiments, when the operation of the flip-flop circuit is described, in the scan MUX circuit 10 and the first latch circuit 20, when the scan enable signal SE is at a logic low level (L), the transistor MP4 is turned on and the transistor MN6 is turned off, and the transistor MP6 is turned off and the transistor MN8 is turned on in response to the inverted scan enable signal nse. When the clock signal CK is at a logic low level (L), the transistor MP8 is turned on, and the signal DN of the node N1 is at a logic high level (H) according to the input data signal D. The transistor MN1 is turned off because the clock signal CK is at the logic low level (L), and the signal DN is stored in the node N1. The NAND circuit 220 receives the clock signal CK of a logic low level (L) and the signal DN of a logic high level (H), and thus the node N2 is at a logic high level (H).

That is, because the node N1 is at the logic low level (L) and the node N2 is at the logic high level (H), the signal of the node N2 is provided to the gate of each of the transistor MN9 and the transistor MP1 as the clock buffer signal CKb so that the transistor MP1 is turned off and the transistor MN9 is turned on.

When the node N3 is at a logic high level (H) and the clock signal CK is at a logic low level (L), the transistor MN3 is turned off, and the transistor MN4 is turned on in response to the signal of the node N1. The node N3 is at the logic low level (L) to turn off the transistor MN2. In other words, the transistor MN2 is not turned on at the same time as the transistor MN3. That is, even when the transistor MP1 and the transistor MN1 are simultaneously turned on during the transition of the clock buffer signal CKb or the clock signal CK, the transistor MN2 is turned off so that the signal DN of the node N1 is not leaked to the VSS terminal and kept at the node N1.

In the second latch circuit 30, because the clock signal CK is at the logic low level (L), the transistor MN10 is turned off, and the transistor MP9 and the transistor MN11 whose gates are connected to the node N2 are turned on. That is, because the signal of the node N2 is not transmitted to the node N4, the first latch circuit 20 may be in a state in which data is stored in the node N2.

When the clock signal CK transitions from a logic low level (L) to a logic high level (H), in the second latch circuit 30, the transistor MP9 and the transistor MN10 are turned on, and the transistor MN11 is turned off. Accordingly, the signal stored in the node N2 is inverted and transmitted to the node N4 as the signal QN, and the transistor MP12 and the transistor MN13 whose gates are connected to the node N4 invert the signal QN and output the inverted signal to the node N7 as the signal QI. Because the transistor MP11 is turned off when the clock signal CK is at the logic high level (H), the signal QN of the node N4 is not connected to the output driver circuit 40 and is stored in the node N7.

The output driver circuit 40 drives the signal QN generated in the previous operation period and outputs the driven signal, and when the clock signal CK transitions from the logic high level (H) back to the logic low level (L), the transistor MP11 of the second latch circuit 30 is turned on, and accordingly, the transistor MP11 and the transistor MN12 are turned on so that the signal QI stored in the node N7 is inverted into the signal QN and output. Subsequently, the output driver circuit 40 re-inverts the signal QN stored by the second latch circuit 30 and outputs the inverted signal as the signal Q.

Referring to FIG. 5, when a clock buffer (for example, clock buffer circuit 50 in FIG. 1) including inverters exists, the inverted clock signal nclk and the re-inverted clock signal bclk are generated on the basis of the input clock signal CK. The inverted clock signal nclk and the re-inverted clock signal bclk are continuously toggled even when the flip-flop circuit 100 is not operated (a period P2) after the data signal D is output as the flip-flop output signal (Q).

However, in the case of the flip-flop circuit according to the exemplary embodiments described with reference to FIGS. 3 and 4, the clock buffer signal CKb of the node N2 is used instead of the inverted clock signal nclk and is no longer toggled in the current operation period P2 after the output signal (Q) of the flip-flop circuit is output. That is, the flip-flop circuit 100 uses the clock buffer signal through the feedback path S and the node N2 without using the inverted clock signal nclk that toggles using the clock buffer circuit 50 and thus may not only reduce power consumption but also operate in synchronization with an input clock signal more accurately.

Figure 6:
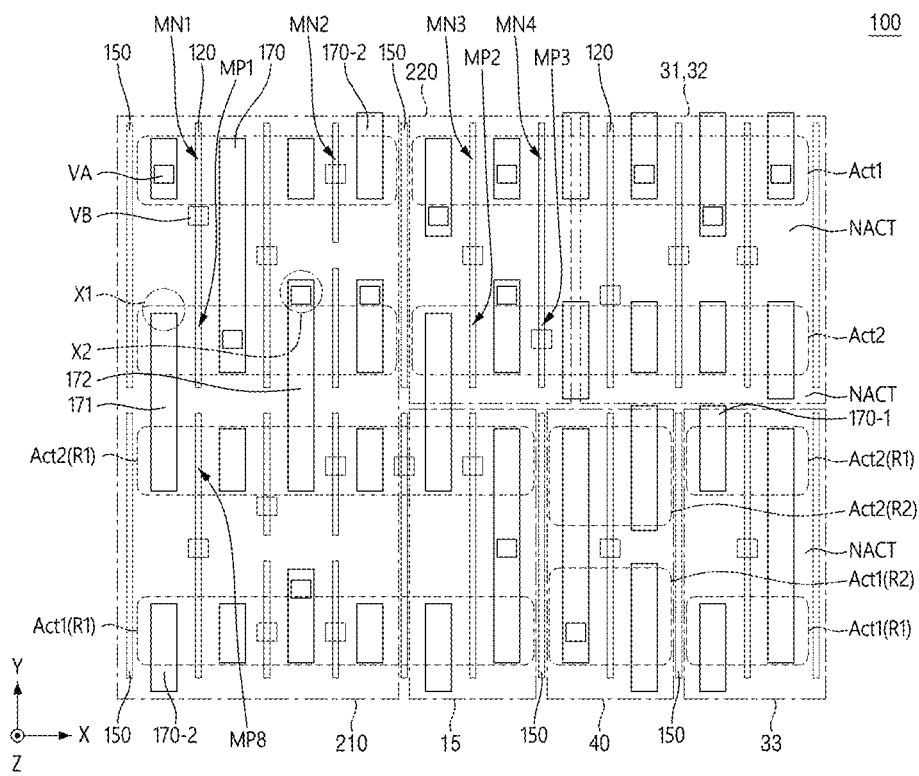
FIGS. 6 to 8 are top views for describing one exemplary embodiment of a layout of the flip-flop circuit of FIG. 4 according to an embodiment.
Figure 7:
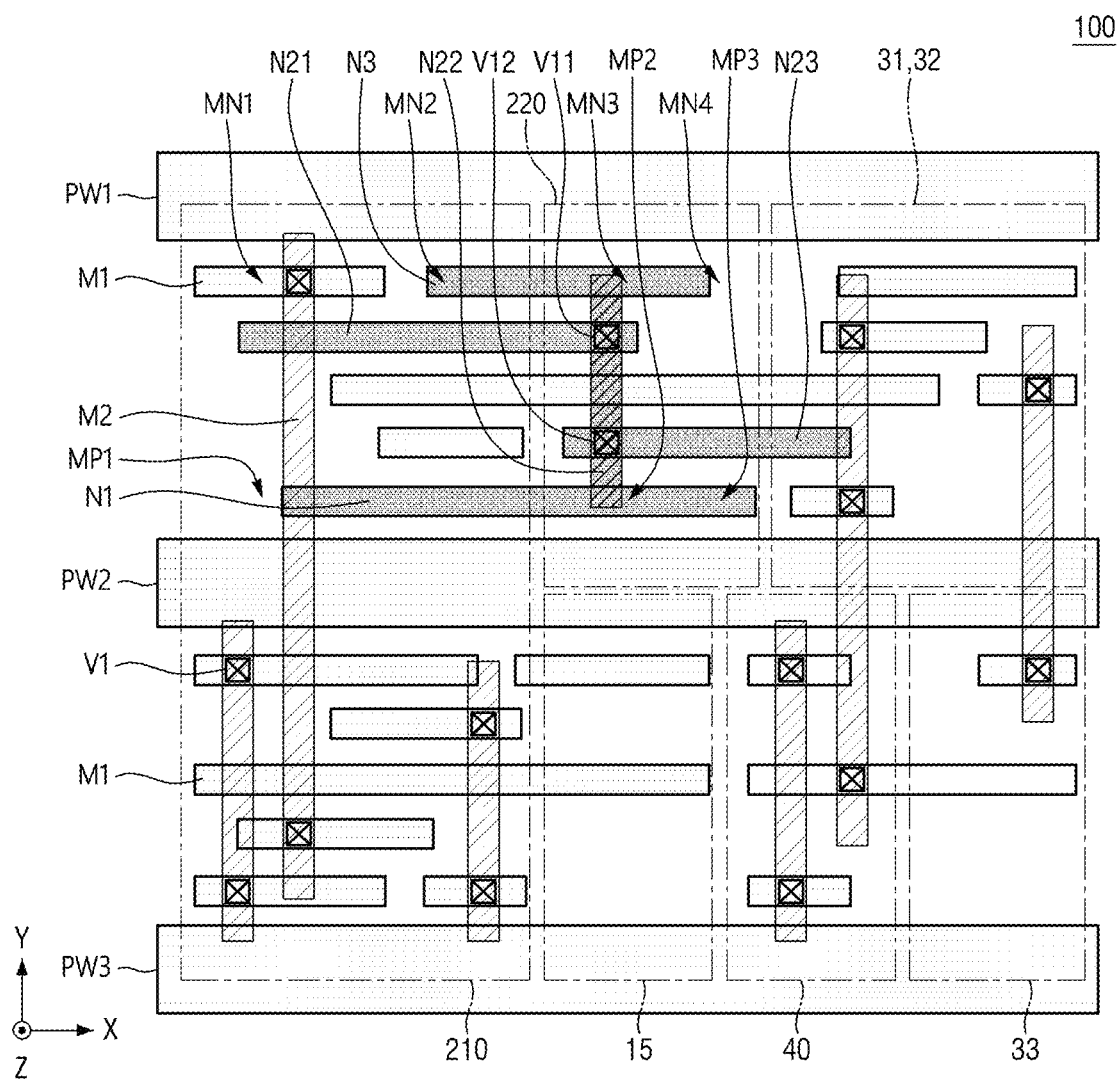
Figure 8:
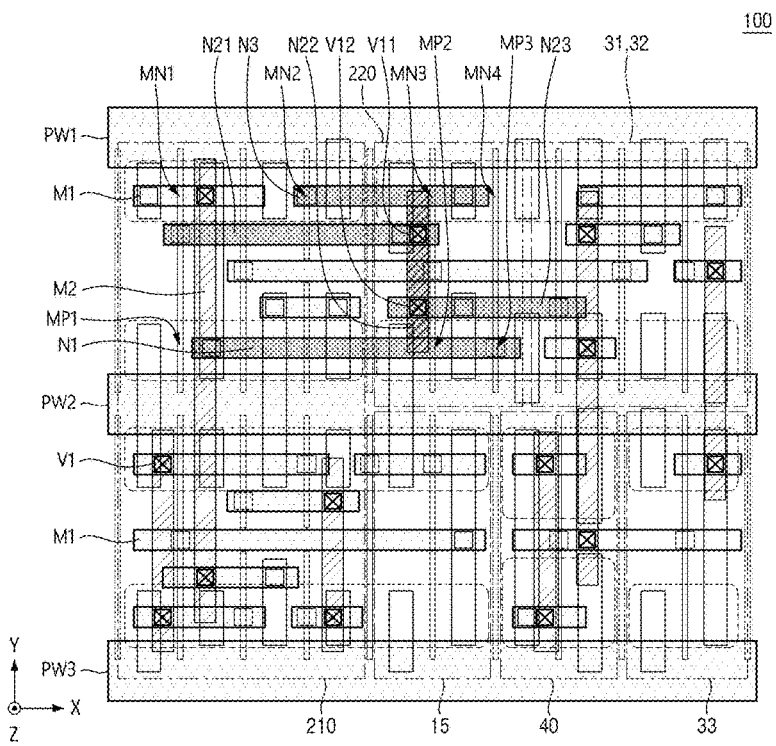

FIGS. 6 to 8 are top views for describing one exemplary embodiment of a layout of the flip-flop circuit of FIG. 4. FIG. 6 is a top view illustrating until a front-end-of-line (FEOL) of the flip-flop circuit 100 according to some exemplary embodiments, FIG. 7 is a top view illustrating until a middle-of-line (MOL), and FIG. 8 is a top view illustrating until a back-end-of-line (BEOL).

Referring to FIGS. 6 to 8, the flip-flop circuit 100 may include a plurality of functional circuits arranged in a double height layout. According to some exemplary embodiments, assuming that the functional circuits are arranged in a plurality of columns, each of the functional circuits may share an interconnection line of a common signal. The flip-flop circuit 100 may include some 210 of the scan MUX circuit and the master latch, the NAND circuit 220, and the OAI circuits including OR circuit 31 and NAND circuit 32 of the slave latch in a first row. The flip-flop circuit 100 may include some of the scan MUX circuit 210 and the master latch, the scan inverter circuit 15, the output driver circuit 40, and the inverter circuit 33 of the slave latch in a second row. For convenience of description, the scan inverter circuit 15, the scan MUX circuit 10, the output driver circuit 40, the inverter circuit 33, the first latch circuit 20 (which may be for example a master latch circuit), and the OAI circuit including OR circuit 31 and NAND circuit 32 are referred to as functional circuits.

Each of the functional circuits may be formed on a substrate. The substrate may be a silicon substrate or a silicon-on-insulator (SOI). Alternatively, the substrate may include silicon germanium, silicon germanium on insulator (SGOI), indium antimonide, lead tellurium compound, indium arsenide, indium phosphide, gallium arsenide, or gallium antimonide, but the present disclosure is not limited thereto.

Each of the functional circuits may include a first active region Act1, a second active region Act2, and an active region separation film NACT. The first active region Act1 may be defined along a first direction X. The first active region Act1 may be defined by a deep trench. The first active region Act1 may be a region in which an n-type transistor is formed. For example, the first active region Act1 may include a well region doped with p-type impurities.

The second active region Act2 may be defined along the first direction X. The second active region Act2 may be defined to be spaced apart from the first active region Act1 in a second direction Y. The first active region Act1 and the second active region Act2 may be separated by a deep trench. The second active region Act2 may be a region in which a p-type transistor is formed. For example, the second active region Act2 may include a well region doped with n-type impurities.

The active region separation film NACT may be formed on the substrate. The active region separation film NACT may cross a space between the first active region Act1 and the second active region Act2. The active region separation film NACT may extend in the first direction X. The active region separation film NACT may fill the deep trench separating the first active region Act1 and the second active region Act2. Meanwhile, the first active region Act1 or the second active region Act2 may have various lengths in the second direction Y according to some exemplary embodiments. For example, a first active region Act1 (R2) may be formed to be longer than a first active region Act1 (R1) in the second direction. For example, a second active region Act2 (R2) may be formed to be longer than a second active region Act2 (R1) in the second direction. Accordingly, a length of the active region separation film NACT in the second direction Y may be changed, and the number of fin patterns (or RX patterns) formed and included in the active region may also be changed. For example, the first active region Act1 (R1) may include two fin patterns, and the first active region Act1 (R2) may include three fin patterns.

A cell separation film may be formed on the substrate. The cell separation film may fill the deep trench separating the first active region Act1 and the second active region Act2. The cell separation film may extend in the first direction X along a boundary of each functional circuit. The active region separation film NACT and the cell separation film may each include an insulating material. The functional circuits according to some exemplary embodiments may include a plurality of gate stacks 120 and a plurality of insulating gates 150. The gate stacks 120 and the insulating gates 150 may each extend along the second direction Y. The gate stack 120 and the insulating gate 150 may be disposed adjacent to each other in the first direction X.

The gate stack 120 and the gate stack 120 or the gate stack 120 and the insulating gate 150, which are disposed adjacent to each other in the first direction X, may be spaced apart from each other by one contacted poly pitch (CPP). As an example, the adjacent gate stacks 120 may be spaced apart from each other by one CPP. As another example, the adjacent gate stack 120 and the insulating gate 150 may be spaced apart from each other by one CPP. As still another example, the adjacent insulating gates 150 may be spaced apart from each other by one CPP.

The gate stack 120 and the insulating gate 150 may each be disposed over the first active region Act1 and the second active region Act2. The gate stack 120 and the insulating gate 150 may each extend from the first active region Act1 to the second active region Act2. According to some exemplary embodiments, the gate stack 120 and the insulating gate 150 may cross the active region separation film NACT. A portion of the gate stack 120 and a portion of the insulating gate 150 may each extend over the cell separation film.

The insulating gate 150 may separate at least a portion of the first active region Act1 from at least a portion of the second active region Act2. When a manufacturing process of forming the insulating gate 150 is taken into account, at least a portion of the first active region Act1 and at least a portion of the second active region Act2 are removed, and then the portions, from which the first active region Act1 and the second active region Act2 are removed, are filled with an insulating material. Accordingly, the insulating gate 150 may be formed. Thus, a portion of a sidewall of the insulating gate 150 may be in contact with the first active region Act1 and the second active region Act2. A portion of the sidewall of the insulating gate 150 may be in contact with a semiconductor material film included in the first active region Act1 and the second active region Act2.

The insulating gate 150 may cross the active region separation film NACT. The insulating gate 150 may be disposed on the active region separation film NACT. A portion of the insulating gate 150 may be recessed into the active region separation film NACT. A portion of the active region separation film NACT may be removed in the process of forming the insulating gate 150. Accordingly, the portion of the insulating gate 150 may be recessed into the active region separation film NACT. A gate spacer may be disposed on the sidewall of the insulating gate 150. The insulating gate 150 may include, for example, an insulating material.

A p-type transistor MP may be formed at a position at which the gate stack 120 intersects the first active region Act1, and an n-type transistor MN may be formed at a position at which the gate stack 120 intersects the second active region Act2.

Each of the functional circuits may include a source/drain contact and a gate contact. Source/drain contacts 170, 170-1, and 170-2 may be disposed on the first active region Act1 and the second active region Act2. The source/drain contacts 170, 170-1, and 170-2 may be connected to a semiconductor pattern formed on the first active region Act1 and the second active region Act2. The semiconductor pattern may be formed between the adjacent gate stack 120 and insulating gate 150. The semiconductor pattern may be formed by removing a portion of the active regions Act1 and Act2 to form a recess and then filling the recess through an epitaxial process.

The source/drain contacts 170, 170-1, and 170-2 may include normal source/drain contacts 170, 171, and 172 and extended source/drain contacts 170-1 and 170-2. The normal source/drain contacts 170, 171, and 172 may entirely overlap the first active region Act1 or the second active region Act2. The normal source/drain contact 170 may overlap the first active region Act1 and the second active region Act2 which are disposed at one height layout (e.g., between PW1 and PW2 or between PW2 and PW3). The normal source/drain contacts 171 and 172 may be disposed to cross a power supply line PW2 while overlapping the second active region Act2 and the first active region Act1 which are disposed at another height layout (e.g., above or below PW2). Some of the extended source/drain contacts 170-1 and 170-2 may extend on the cell separation film and a cell gate cut pattern. The extended source/drain contacts 170-1 and 170-2 may be connected to power supply lines PW1, PW2, and PW3 (in FIG. 7).

In addition, the source/drain contact 170 may be formed to have a different length in a direction of the active region separation film NACT on the basis of a boundary between the first active region Act1 or the second active region Act2 and the active region separation film NACT. For example, when a region X1 and a region X2 are compared, the source/drain contact 171 in the region X1 may be formed only up to a boundary between the active regions ACT1 and ACT2 and the active region separation film NACT, but the source/drain contact 172 in the region X2 may be formed to extend partially to the active region separation film NACT. The case in which the source/drain contact 171 or 172 partially extends to the active region separation film NACT or the case in which the source/drain contact 171 or 172 does not partially extend to the active region separation film NACT may be determined according to a position (e.g., a first metal line pattern) on which a first metal line is to be formed.

A gate contact is formed on the gate stack 120 and is not formed on the insulating gate 150. The gate contact may be connected to the gate stack 120. For example, the gate contact may be electrically connected to a gate electrode of the gate stack 120. The gate contact may be disposed on the first active region Act1 and the second active region Act2. In addition, the gate contact may also be formed on the active region separation film NACT. In an integrated circuit according to some exemplary embodiments, at least one of the gate contacts may be disposed at a position that overlaps one of the first active region Act1 and the second active region Act2.

The functional circuits according to some exemplary embodiments may include source/drain vias VA, gate vias VB, metal lines M1 and M2, and the power supply lines PW1, PW2, and PW3. The gate via VB may be formed on the gate contact. The gate vias VB may connect the gate contact and the metal lines M1 and M2. The source/drain vias VA may be formed on the source/drain contacts 170, 171, 172, 170-1, and 170-2. The source/drain via VA may be connected to at least some of each of the source/drain contacts 170, 171, 172, 170-1, and 170-2. The source/drain via VA may include normal vias connecting the normal source/drain contacts 170, 171, and 172 and the metal lines M1 and M2, and power supply line vias connecting the extended source/drain contacts 170-1 and 170-2 and the power supply lines PW1, PW2, and PW3.

A first metal line M1, a third metal line M3, and the power supply lines PW1, PW2, and PW3 may extend in the first direction X. The power supply lines PW1, PW2, and PW3 may include supply power lines PW1 and PW3 to which a first voltage is applied, and a ground power line PW2 to which a second voltage is applied. The supply power lines PW1 and PW3 may supply power to the p-type transistors, and the ground power line PW2 may supply power to the n-type transistors.

The first metal line M1 may be electrically connected to the gate stack 120 or the source/drain contacts 170, 171, 172, 170-1, and 170-2 through the gate vias VB or the source/drain vias VA. A second metal line M2 may be electrically connected to the first metal line M1 through a first via V1.

The second metal line M2 may extend in the second direction Y and perpendicularly intersect the first metal line M1. The third metal line M3 may extend in the first direction X, may be spaced apart from and parallel to the first metal line M1 in a third direction Z, and may perpendicularly intersect the second metal line M2.

Referring to FIGS. 6 to 8, some of the transistors included in the first latch circuit 20 and the second latch circuit 30 of the flip-flop circuit of FIG. 4 are shown. A power ground voltage VSS may be applied to the supply power line PW1 and PW3, a power supply voltage VDD may be applied to the power supply line PW2, the first active region Act1 may be a well region doped with n-type impurities, and the second active region Act2 may be a well region doped with p-type impurities.

For example, the transistors MN1 to MN4 of the first latch circuit 20 may be formed at positions at which the gate stacks 120 and the first active region Act1 of a first row intersect, and the transistor MP1 to MP3 may be formed at positions at which the gate stacks 120 and the second active region Act2 of a second row intersect.

When the circuit of FIG. 4 is described with reference to FIGS. 6 to 8, in the feedback pass region of the scan MUX circuit 210 and the first latch circuit, the gate stack 120 of the transistor MN4 is connected to the drain contact 170 of the transistor MP1 through the first metal line M1, which may correspond to the node N1. The drain contact 170 of the transistor MP2, the drain contact of the transistor MP3, the gate contact of the transistor MP9, and the gate contact of the transistor MN11 are connected through first metal lines M1, N21, and N23 and second metal lines M2 and N22 as the node N2. The first and second metal lines of the node N2 electrically connect the drain contact 170 of the transistor MP2, the drain contact of the transistor MP3, the gate contact of the transistor MP9, and the gate contact of the transistor MN11. That is, the clock buffer signal CKb is generated at the node N2, which is an output line of the NAND circuit 220 in the first latch circuit 20, and the node N2 is connected to the transistor MP1 and the scan MUX circuit 10, so that the clock buffer signal CKb is provided to the gates of the transistors.

That is, when the inverted clock signal nclk is required in the flip-flop circuit 100, an inverted clock signal generated by toggling in one clock buffer circuit (e.g., the clock buffer circuit 50 of FIG. 1) may be connected to circuits included in flip-flop circuit 100 through a plurality of metal lines of a plurality of layers so that the inverted clock signal nclk may be supplied. However, in the case of the present disclosure, when the clock buffer signal CKb generated at the output terminal of the first latch circuit 20 is used, a clock signal may be supplied using a smaller number of first and second metal lines without having complicated routing of metal lines so that convenience in a place and routing (P/R) design may be improved.

Figure 9:
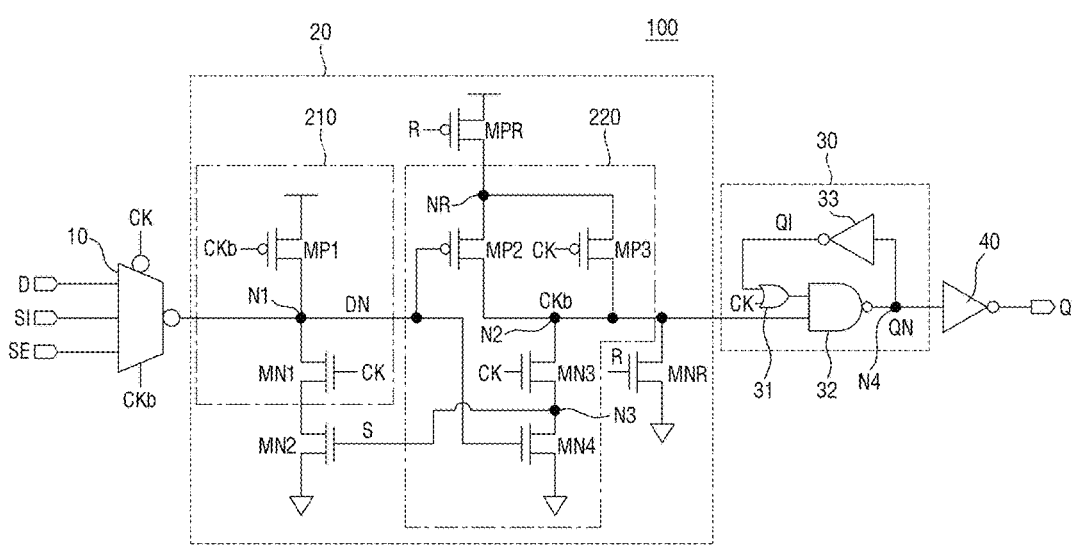
FIG. 9 is a circuit diagram illustrating a flip-flop circuit according to an embodiment.

FIG. 9 is a circuit diagram illustrating a flip-flop circuit according to some exemplary embodiments. For convenience of description, differences between the following exemplary embodiment and the above-described exemplary embodiments will be mainly described, and descriptions of the remaining elements will be the same.

Referring to FIG. 9, a first latch circuit 20 according to some exemplary embodiments may further include at least one reset transistor configured to reset a node N2, which may be for example a data storage node. That is, the first latch circuit 20 may include a transistor MP1, a transistor MN1, a transistor MN2, a NAND circuit 220, and reset transistors MPR and MNR.

The first latch circuit 20 may include the reset transistor MPR between the power supply terminal and a node NR. The reset transistor MPR and the NAND circuit 220 are connected in series between the power supply terminal and the VSS terminal. Further, the first latch circuit 20 may include the reset transistor MNR between the node N2 and the VSS terminal. A gate of each of the reset transistor MPR and the reset transistor MNR receives a reset signal R.

The NAND circuit 220 may include a transistor MP2 and a transistor MP3 connected in parallel between the node NR and the node N2, and a transistor MN3 and a transistor MN4 connected in series between the node N2 and the VSS terminal. The transistor MN3 is connected between the node N2 and a node N3, and the transistor MN4 is connected between the node N3 and the VSS terminal. A gate of each of the transistor MP2 and the transistor MN4 is connected to a node N1, and the clock signal CK may be supplied to a gate of each of the transistor MP3 and the transistor MN3.

The first latch circuit 20 may reset data stored in the first latch circuit 20 in response to the reset signal R. According to some exemplary embodiments, a flip-flop circuit 100 may reset the data of the first latch circuit 20 by applying the reset signal R before performing a flip-flop operation. According to some exemplary embodiments, the flip-flop circuit 100 may reset data stored in the node N2 of the first latch circuit 20 by applying the reset signal R after completing the flip-flop operation. In embodiments, the flip-flop circuit 100 may periodically or intentionally apply the reset signal R to reset the data of the first latch circuit 20 according to setting.

Figure 10:
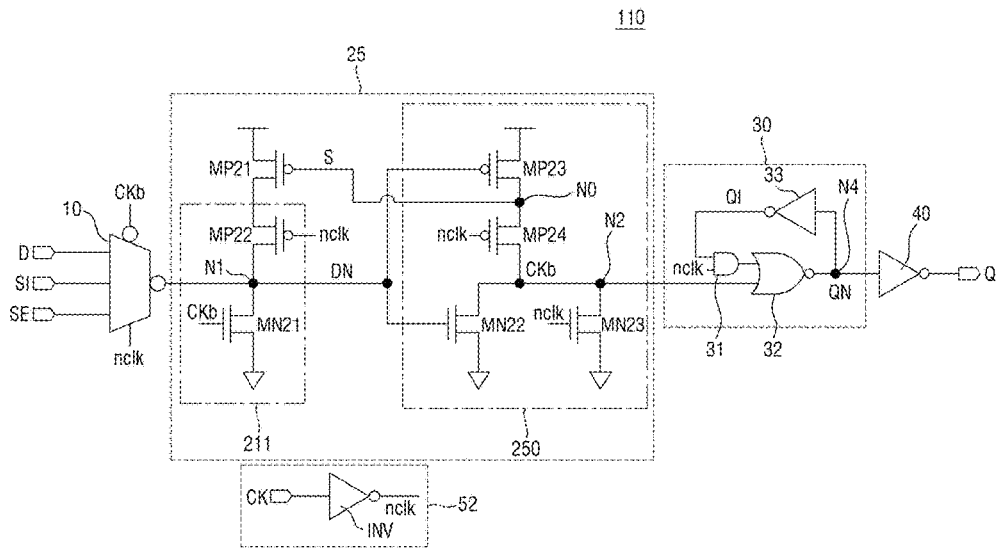
FIG. 10 is a circuit diagram illustrating a flip-flop circuit according to an embodiment.

FIG. 10 is a circuit diagram illustrating a flip-flop circuit 110 according to some exemplary embodiments. In embodiments, flip-flop circuit 110 may correspond to flip-flop circuit 100. For convenience of description, differences between the following exemplary embodiment and the above-described exemplary embodiments will be mainly described, and descriptions of the remaining elements will be the same.

Referring to FIG. 10, according to some exemplary embodiments, a flip-flop circuit 110 includes a scan MUX circuit 10, a first latch circuit 25, a second latch circuit 30, an output driver circuit 40, and an inverted clock generation circuit 52.

The inverted clock generation circuit 52 includes one inverter circuit to generate an inverted clock signal nclk on the basis of the input clock signal CK. In the following description of FIG. 10, for differentiation, a clock buffer signal generated at a node N2 is denoted by CKb, and the inverted clock signal generated by the inverted clock generation circuit 52 is denoted by nclk.

Unlike in the scan MUX circuit in FIGS. 3 to 6, the clock signal CK and the clock buffer signal CKb are switched and input to the scan MUX circuit 10 in FIG. 10. That is, the clock buffer signal CKb is input to a gate of a transistor MP8, and the inverted clock signal nclk is input to a gate of a transistor MN9.

According to some exemplary embodiments, the first latch circuit 25 includes two p-type transistors MP21 and MP22 and an n-type transistor MN21 that are connected in series between the power supply terminal and the VSS terminal, and a NOR circuit 250. Specifically, a gate of the transistor MP21 is connected to a node NO of the NOR circuit 250. The transistor MP22 is connected between a drain terminal of the transistor MP21 and a node N1 and has a gate to which the inverted clock signal nclk is input. The transistor MN21 is connected between the node N1 and the VSS terminal and has a gate connected to the node N2.

The NOR circuit 250 receives a data signal DN of the node N1 and the inverted clock signal nclk and outputs a NOR operation result signal to the node N2.

The NOR circuit 250 may include a transistor MP23 and a transistor MP24 connected in series between the power supply terminal and the node N2, and a transistor MN22 and a transistor MN23 connected in parallel between the node N2 and the VSS terminal.

A gate of each of the transistor MP23 and the transistor MN22 is connected to the node N1, and the inverted clock signal nclk is input to a gate of each of the transistor MP24 and the transistor MN23.

Even in the case of the NOR circuit 250, the gate of the transistor MP21 is connected to the node NO to form a feedback path S. Whether an output signal of the scan MUX circuit 10 is stored in the node N1 is determined on the basis of the clock buffer signal CKb and a signal S of the node NO. Because the transistor MP21 is connected between the power supply terminal and a source terminal of the transistor MP22 and is turned on/off on the basis of the feedback signal S applied to the gate of the transistor MP21, the signal DN stored in the node N1 may be maintained even by the transition of the inverted clock signal nclk.

The first latch circuit 25 of FIG. 10 operates as the NOR circuit 250, but due to the characteristics of a p-type transistor, by generating and using the inverted clock signal nclk in the inverted clock generation circuit 52, the first latch circuit 25 and the second latch circuit 30 may each latch and then transmit the input data signal D in response to the transition of the clock signal CK similar to the operation described in FIGS. 3 and 4.

Figure 11:
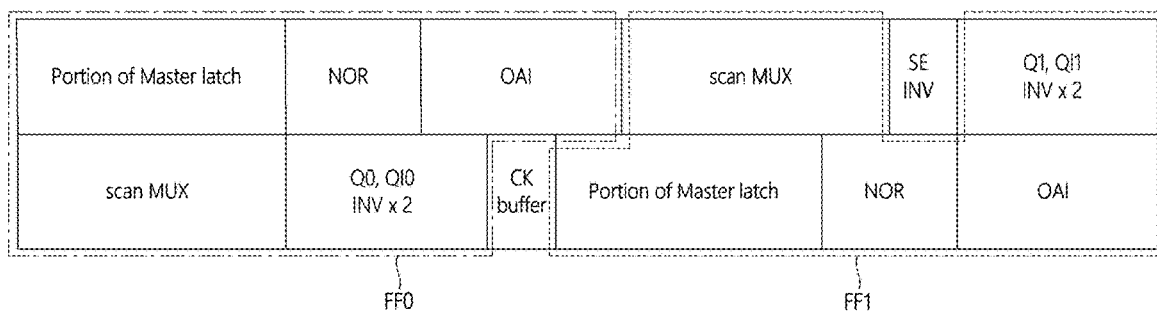
FIG. 11 is a conceptual diagram for describing a layout of the flip-flop circuit of FIG. 7 according to an embodiment.

FIG. 11 is a conceptual diagram for describing a layout of the flip-flop circuit of FIG. 8.

A plurality of flip-flop circuits may share one clock buffer circuit and one scan inverter circuit. The example shown in FIG. 11 is an example in which the flip-flop circuit is implemented in a double height layout. The term "height layout" used herein refers to between a first power supply metal line and a second power supply metal line. A single height layout refers to a case in which a circuit is disposed between the first power supply metal line and the second power supply metal line, and the double height layout refers to a case in which a circuit is disposed between three power supply metal lines. On the same principle, it is assumed that a circuit disposed between three or more power supply metal lines is implemented in a multi-height layout.

In FIG. 11, the clock buffer circuit CK buffer (50) and the scan inverter circuit SE INV (15) may each be connected to a first flip-flop circuit FF0 and a second flip-flop circuit FF1. Specifically, the first flip-flop circuit FF0 is formed in a double height layout and may include the master latch (MP21, MP22, and MN21), the NOR circuit 250, some of the slave latch (the OAI circuit including OR circuit 31 and NAND circuit 32), and the scan inverter circuit SE INV in a first column, and may include the scan MUX circuit 10, two inverter circuits Q0 and Q10, and the clock buffer circuit CK buffer in a second column. The second flip-flop circuit FF1 may include the scan MUX circuit 10, the scan inverter circuit SE INV (15), and two inverter circuits Q1 (33) and Q11 (40) in a first column and may include the clock buffer circuit CK buffer (50), the master latch, and the OAI circuit including OR circuit 31 and NAND circuit 32 in a second column. The two inverter circuits Q0 and Q10 or Q1 and Q11 may be, for example, the inverter circuit 33 and an inverter circuit included in output driver circuit 40 of FIG. 3.

In the illustrated example, the scan inverter circuit 15 is disposed in the middle of the first column of the second flip-flop circuit FF1, and the clock buffer circuit 50 of FIG. 1 is disposed between the first flip-flop circuit FF0 and the second flip-flop circuit FF1 in the second column, but the scan inverter circuit 15 and the clock buffer circuit 50, which may be shared by the plurality of flip-flop circuits, may both be disposed in the middle of the first flip-flop circuit FF0 and the second flip-flop circuit FF1 according to another exemplary embodiment, may be disposed on one side of any one flip-flop circuit FF0 or FF1 according to still another exemplary embodiment, or may be disposed in the middle of any one flip-flop circuit according to yet another exemplary embodiment. That is, the flip-flop circuit of the present disclosure is not limited to the arrangement of the illustrated example.

Figure 12:
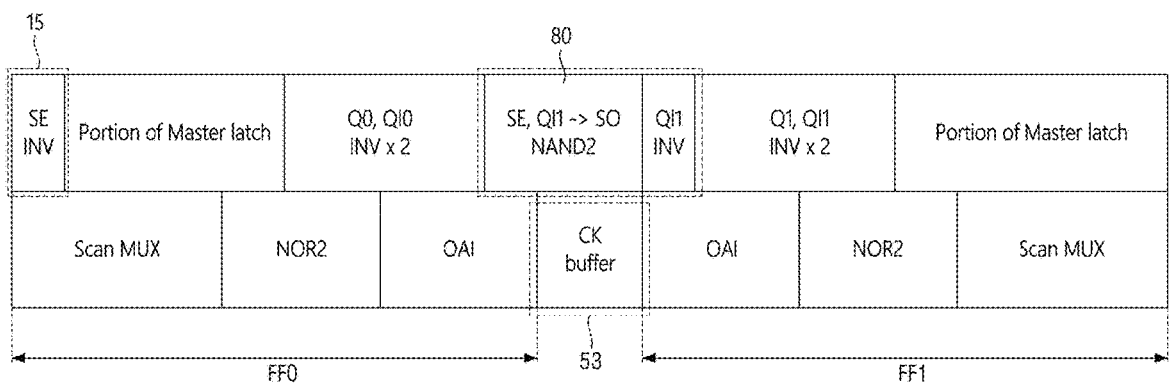
FIG. 12 is a conceptual diagram for describing a layout of a flip-flop circuit according to an embodiment.

FIG. 12 is a conceptual diagram for describing a layout of a flip-flop circuit according to some exemplary embodiments.

According to some exemplary embodiments, the flip-flop circuit may be implemented as shown in FIG. 12. As illustrated in the drawing, a first flip-flop circuit FF0 may be implemented in a double height layout and may include a scan inverter circuit SE INV (15), some circuits of a master latch, and two inverters in a first row and may include a scan MUX circuit, a NOR circuit of the master latch, and an OAI circuit of a slave latch in a second row.

However, the scan inverter circuit SE INV (15) and the scan output circuit 80 (NAND2 and Q11) in the first row, and a clock buffer CK buffer 53 in the second row may be disposed between the first flip-flop circuit FF0 and an adjacent second flip-flop circuit FF1. That is, according to some exemplary embodiments, the adjacent second flip-flop circuit FF1 may be disposed in a form symmetrical to the first flip-flop circuit FF0, as if flipped over the scan output circuit 80 (NAND2 and Q11) of the first row and the clock buffer of the second row.

In the adjacent second flip-flop circuit FF1, a first row may include a master latch and inverters (Q1 and Q11), which are some of a slave latch, next to the scan output circuit (NAND2), and a second row may include an OAI circuit, a NOR circuit, and a scan MUX circuit, which are among the slave latch, next to the clock buffer circuit.

Figure 13:
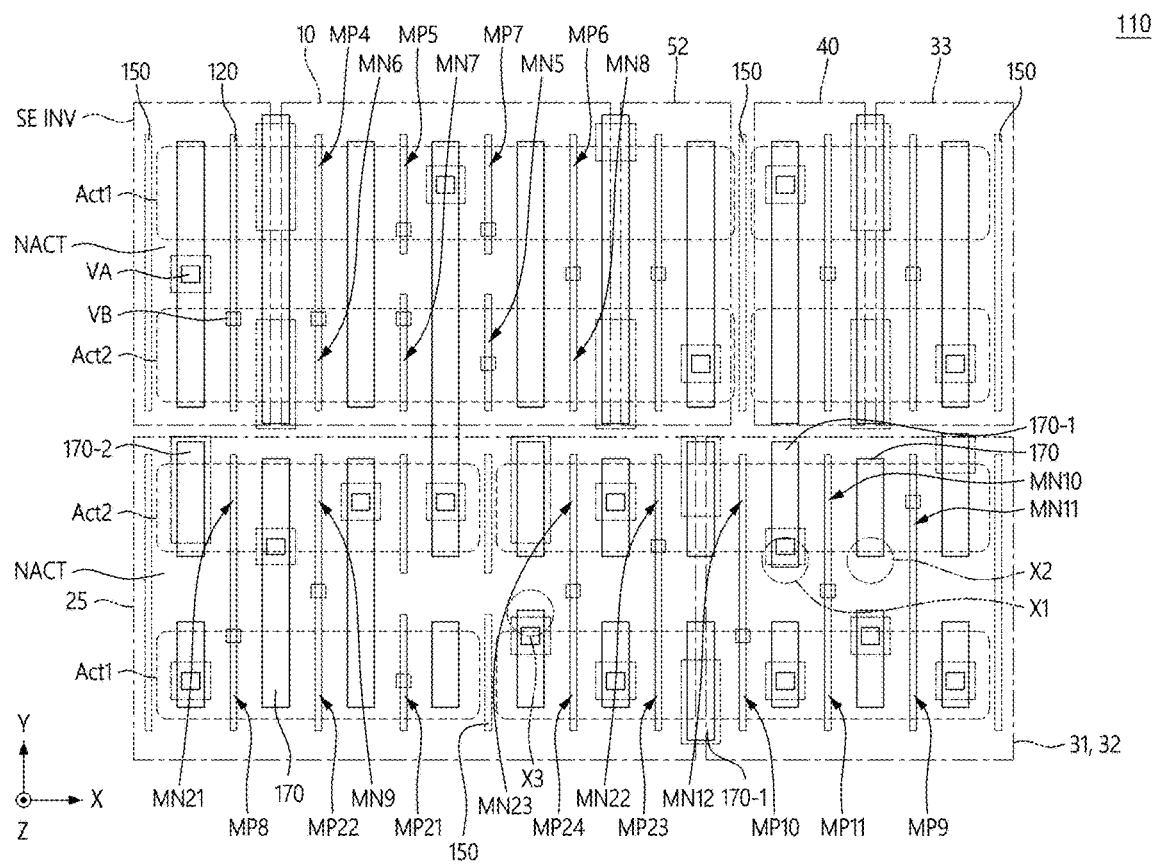
FIGS. 13 to 15 are top views for describing one exemplary embodiment of a layout of the flip-flop circuit of FIG. 8 according to an embodiment.
Figure 14:
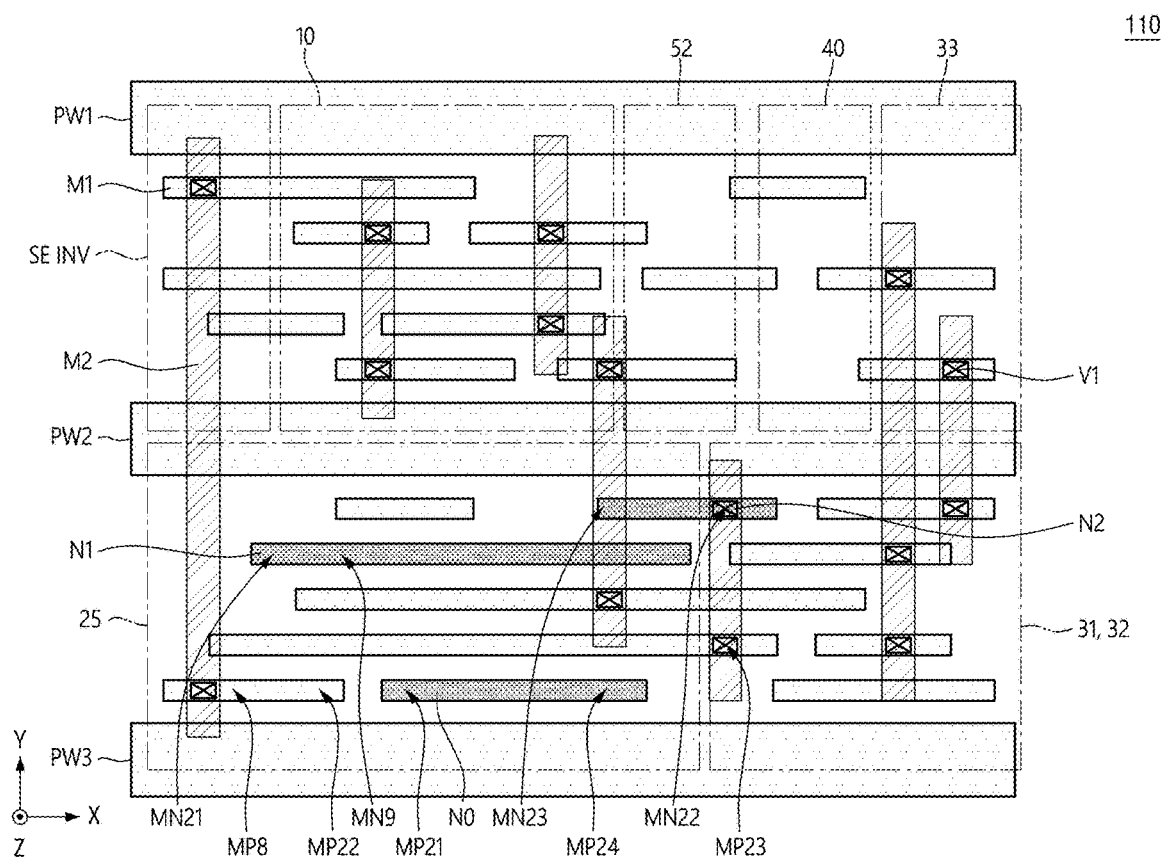
Figure 15:
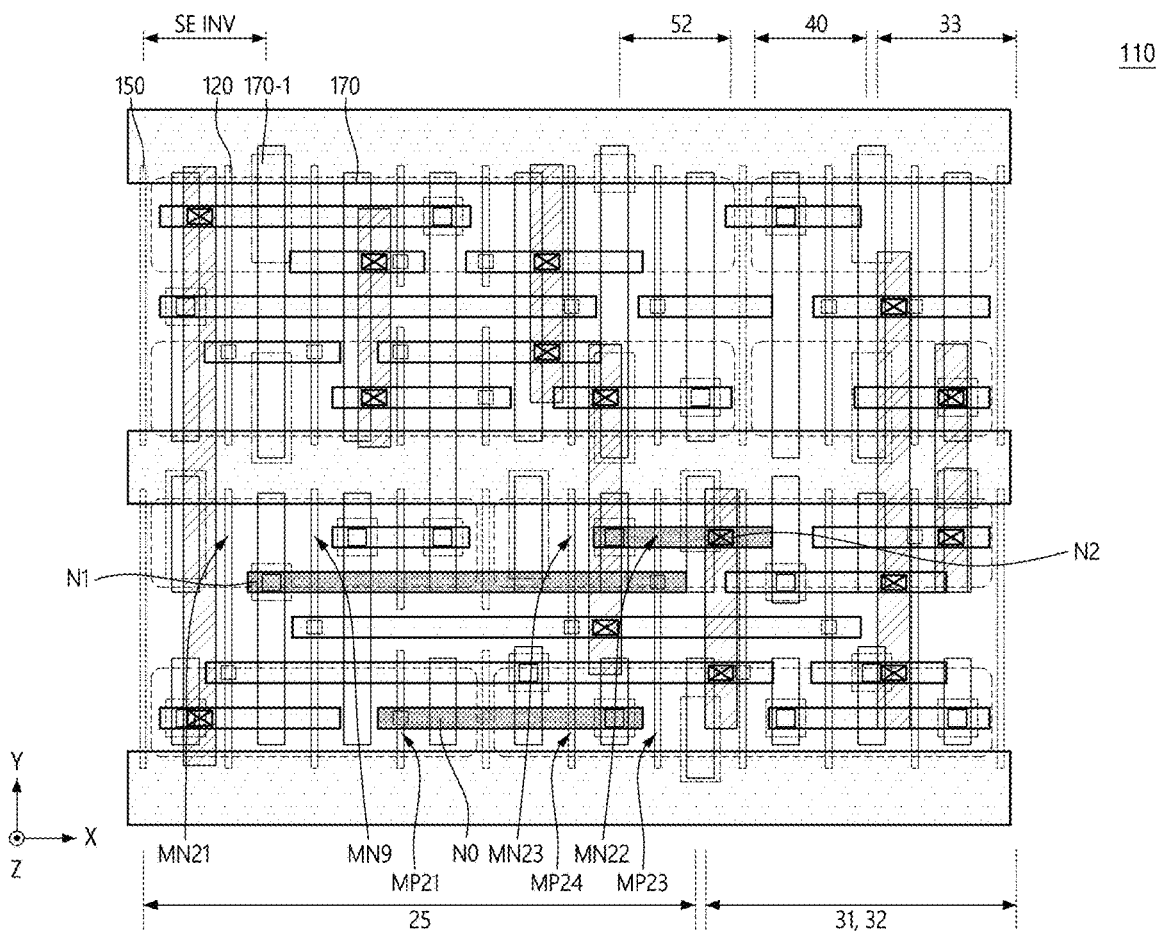

FIGS. 13 to 15 are top views for describing one exemplary embodiment of a layout of the flip-flop circuit of FIG. 10. FIGS. 13 to 15 are views illustrating the flip-flop circuit 110 of FIG. 10. FIG. 13 is a top view illustrating until a FEOL of the flip-flop circuit 110 according to some exemplary embodiments, FIG. 14 is a top view illustrating until a MOL, and FIG. 15 is a top view illustrating until a BEOL. For convenience of description, only differences in the arrangement of each of the functional circuits with those of FIGS. 6 to 8 will be described, and descriptions overlapping with those of FIGS. 6 to 8 will be omitted.

Referring to FIGS. 13 to 15, the flip-flop circuit 110 may include a plurality of functional circuits arranged in a double height layout. The flip-flop circuit 110 may include the scan inverter circuit 15, the scan MUX circuit 10, the inverted clock generation circuit 52 (which may be related to, for example, a clock buffer circuit), the output driver circuit 40, and the inverter circuit 33 of the slave latch, in a first row. The flip-flop circuit 110 may include the first latch circuit 25 (which may be for example a master latch circuit) and the AOI circuit including OR circuit 31 and NAND circuit 32 of the slave latch in the second row.

Referring to FIG. 13, in the flip-flop circuit 110 of FIG. 10, some of the transistors included in the scan MUX circuit 10, the first latch circuit 25, the second latch circuit 30, the output driver circuit 40, and the inverted clock generation circuit 52 (which may be related to, for example, a clock buffer circuit) are shown. Power lines PW1, PW2, and PW3 may include supply power lines PW1 and PW3 to which a first voltage is applied, and a ground power line PW2 to which a second voltage is applied. The supply power lines PW1 and PW3 supply power to p-type transistors, and the ground power line PW2 supplies power to n-type transistors. The first active region Act1 may be a well region filled with p-type impurities, and the second active region Act2 may be a well region filled with n-type impurities.

For example, the transistors MN21 to MN23 and MN9 of the first latch circuit 25 may be formed at positions at which the gate stacks 120 and the second active region Act2 of a second row intersect, and the transistor MP21 to MP24 and MP8 may be formed at positions at which the gate stacks 120 and the first active region Act1 of the second row intersect.

Referring to the layouts of FIGS. 13 to 15 with reference to the first latch circuit 25 shown in FIG. 10, the gate stack 120 of the transistor MP21 is connected to a drain contact 170 of the transistor MP23 through a first metal lines M1 (node NO). A drain contact 170 of the transistor MN9, a drain contact of the transistor MN21, a gate contact of the transistor MP23, and a gate contact of the transistor MN22 are connected through the first metal line M1 (node N1) and a second metal line M2. A first metal line and a second metal line of the node N2 electrically connect a drain contact of the transistor MN22, a drain contact of the transistor MN23, and a drain contact of the transistor MP24. That is, the clock buffer signal CKb is generated at the node N2, which is an output line of the first latch circuit 25, and the node N2 is connected to the transistor MP1 and the scan MUX circuit 10 so that the clock buffer signal CKb is supplied to the gates of the transistors.

That is, when the inverted clock signal is required in the flip-flop circuit 110, an inverted clock signal generated by toggling in one clock buffer circuit 50 may be connected to circuits included in flip-flop circuit 110 through a plurality of metal lines of a plurality of layers so that the inverted clock signal nclk may be supplied. However, in the case of the present disclosure, when the clock buffer signal CKb of the node N2 of the first latch circuit 25 is used, a smaller number of first and second metal lines may be used without having complicated routing of metal lines so that convenience in design may be improved.

Figure 16:
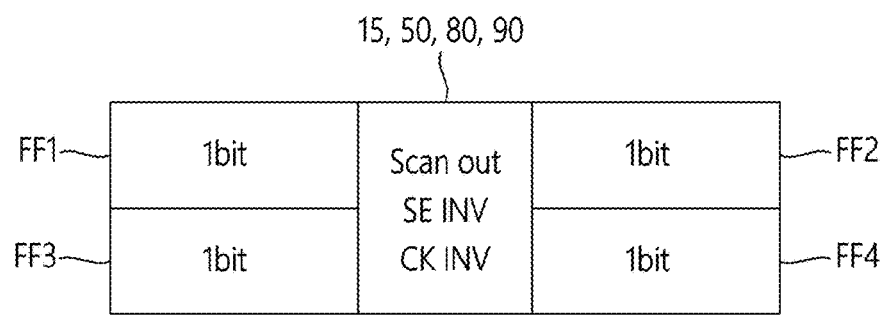
FIGS. 16 and 17 are conceptual diagrams for describing the arrangement of functional circuits in a flip-flop circuit according to an embodiment.
Figure 17:
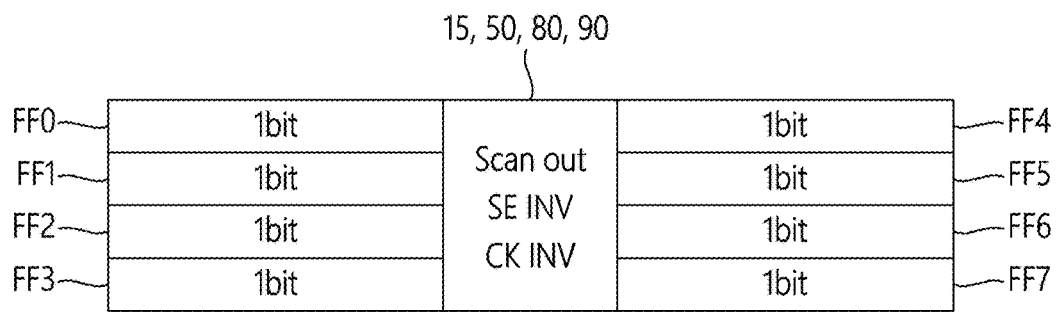

FIGS. 16 and 17 are conceptual diagrams for describing the arrangement of functional circuits in a flip-flop circuit according to some exemplary embodiments.

Referring to FIG. 16, one scan output circuit Scan out (80), one scan inverter circuit SE INV (15), and one clock buffer circuit CK INV (50) are disposed between a plurality of flip-flop circuits and shared by the plurality of flip-flop circuits. That is, one scan output circuit Scan out (80), one scan inverter circuit SE INV (15), and one clock buffer circuit CK INV (50) may be disposed between a first flip-flop circuit FF1 and a second flip-flop circuit FF2 in a first column and may be disposed between a first flip-flop circuit FF3 and a second flip-flop circuit FF4 in a second column.

According to some exemplary embodiments, each flip-flop circuit may operate in one bit unit simultaneously or separately. According to some exemplary embodiments, each flip-flop circuit may be formed in a single height layout or multi-height layout. For example, when one flip-flop circuit is implemented in a double height layout as shown in FIGS. 13 to 15, the layout of the flip-flops of FIG. 16 may be implemented as a 4-bit latch in a quad height layout. As another example, when one flip-flop circuit is implemented in a single height layout as shown in FIG. 17, an 8-bit flip-flop layout may be implemented in a quad height layout.

Figure 18:
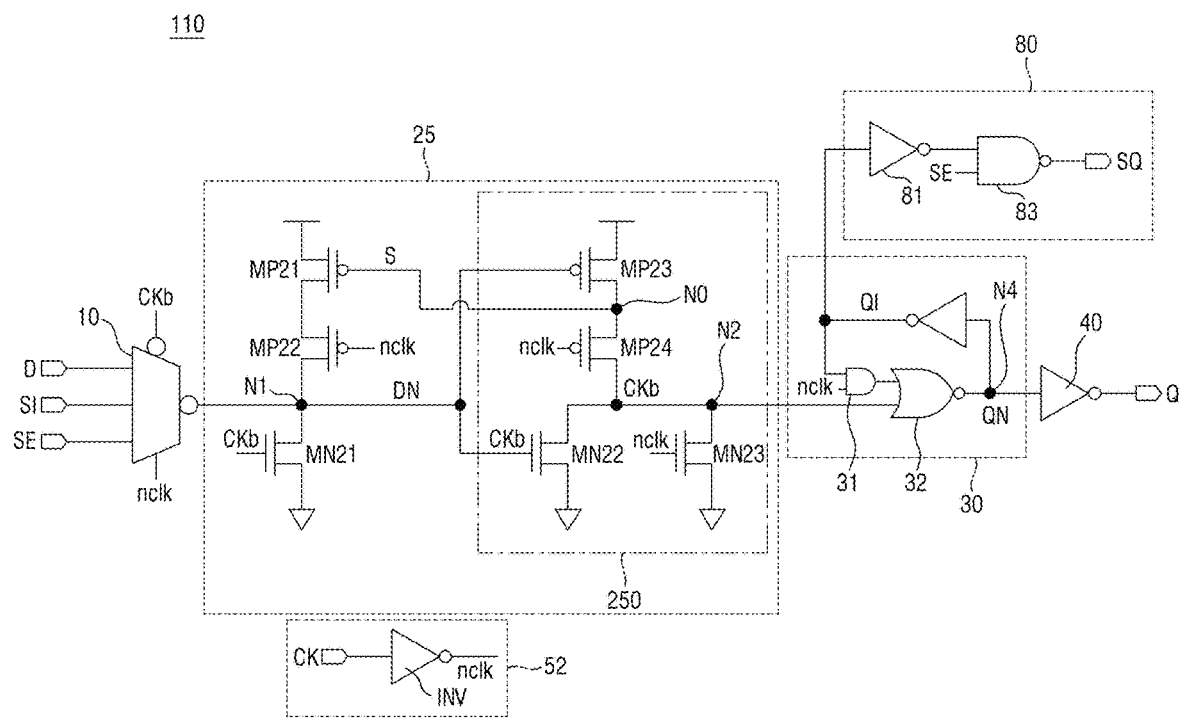
FIG. 18 is a circuit diagram illustrating a flip-flop circuit according to an embodiment.

FIG. 18 is a circuit diagram illustrating a flip-flop circuit 110 according to some exemplary embodiments. For convenience of description, differences between the following exemplary embodiment and the exemplary embodiment of FIG. 10 will be mainly described, and descriptions of the remaining elements will be the same.

According to some exemplary embodiments, a flip-flop circuit 110 includes a scan MUX circuit 10, a first latch circuit 25, a second latch circuit 30, an output driver circuit 40, and an inverted clock generation circuit 52. However, unlike the flip-flop circuit 110 of FIG. 10, the flip-flop circuit 110 of FIG. 18 further includes a scan output circuit 80.

The scan output circuit 80 is connected to a feedback terminal of the second latch circuit 30. More specifically, the scan output circuit 80 is connected to an output terminal of an inverter circuit 33. According to some exemplary embodiments, the scan output circuit 80 includes an inverter circuit 81 and a NAND circuit 83. The inverter circuit 81 receives and inverts an output signal QI, and the inverted signal is subjected to a NAND operation together with a scan enable signal SE, and the operation result is output as a signal SQ.

The flip-flop circuit 110 including the scan output circuit 80 of FIG. 18 may be a flip-flop of the last stage in a multi-flip-flop circuit of FIG. 16 or FIG. 17.

For example, in FIG. 17, it is assumed that flip-flop circuits are connected in the order of FF0, FF1, FF2, FF3, FF4, FF5, FF6, and FF7. An output of the flip-flop circuit of a front stage is connected to an input of the flip-flop circuit of a rear stage. For example, when it is assumed that input signals of FF0 are DO, SI, SE, and CK, and output signals of FF0 are Q0 and Q10 (for example QI of the second latch circuit 30), FF1 receives Q10 as an input signal of SI. SE and CK may be input so that the remaining inputs are common with those of FF0. D is separately received, but QI is received from the flip-flop circuit (for example the output terminal of the output driver circuit 40) of the front stage according to a scan chain. The scan chain in which flip-flop circuits are connected to each other may be implemented, and the flip-flop FF7 at the last stage may include the scan output circuit 80 as shown in FIG. 18.

Figure 19:
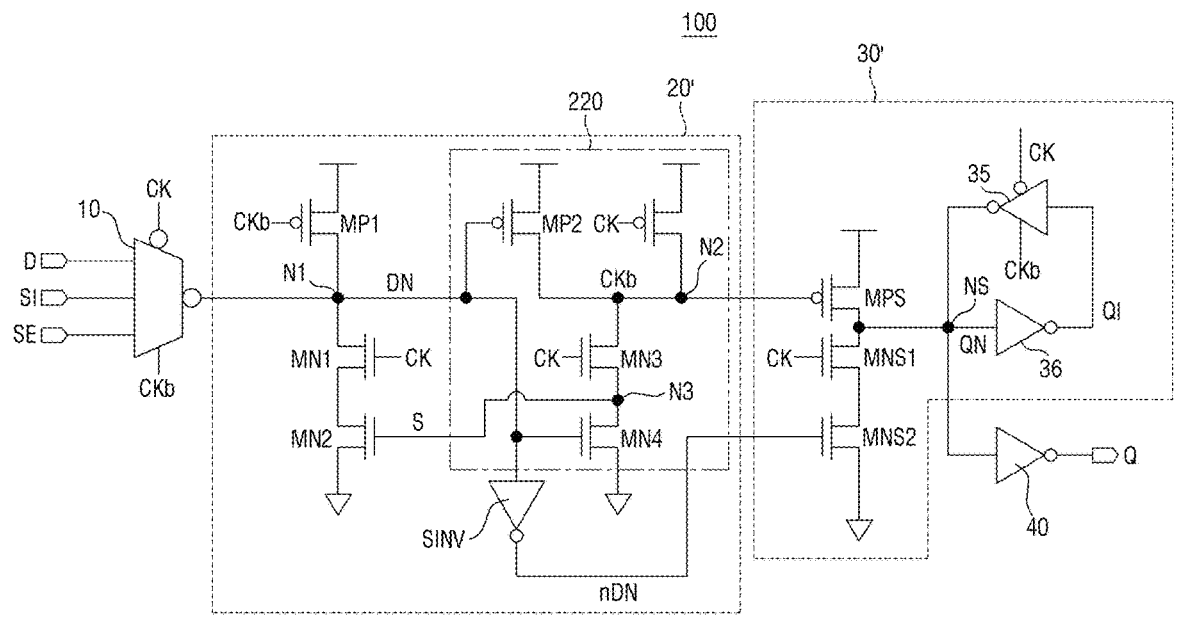
FIG. 19 is a circuit diagram illustrating a flip-flop circuit according to an embodiment.

FIG. 19 is a circuit diagram illustrating a flip-flop circuit 100 according to some exemplary embodiments. For convenience of description, differences between the following exemplary embodiment and the exemplary embodiment of FIG. 4 will be mainly described, and descriptions of the remaining elements will be the same.

According to some exemplary embodiments, as shown in FIG. 19, a second latch circuit 30' may be implemented as a transistor MPS, a transistor MNS1, and a transistor MNS2, which are connected in series between the power supply terminal and the VSS terminal, a tristate circuit 35, and an inverter circuit 36.

More specifically, in the second latch circuit 30', the transistor MP5, the transistor MNS1, and the transistor MNS2 may be connected in series between the power supply terminal and the VSS terminal. A gate of the transistor MPS is connected to a node N2, and a drain terminal of the transistor MP5 may be connected to a node NS, which is an output terminal of the second latch circuit 30'. The transistor MNS1 and the transistor MNS2 are connected in series between the node NS and the VSS terminal.

The clock signal CK is input to a gate of the transistor MNS1, and an output terminal of a data inverter circuit SINV is connected to a gate of the transistor MNS2.

According to some exemplary embodiments, a first latch circuit 20 may further include the data inverter circuit SINV. That is, the first latch circuit 20 may include an inverter circuit (MP1 and MN1), a transistor MN2, a NAND circuit 220, and the data inverter circuit SINV. The data inverter circuit SINV is connected between a node N1 and the gate of the transistor MNS2 of the second latch circuit 30' and provides a signal nDN, which is obtained by inverting a signal of the node N1, to the gate of the transistor MNS2.

As described above, because the node N1 is at a logic low level (L) and the node N2 is at a logic high level (H), a signal of the node N2 is used as the clock buffer signal CKb, and the data inverter circuit SINV inverts the signal DN of the node N1 and provides the inverted signal nDN to the transistor MNS2. That is, the gate of each of the transistor MPS and the transistor MNS2 should be provided with a non-inverted data signal nDN, and the transistor MP5 may be gated by the clock buffer signal CKb of the node N2, in which the signal of the node N1 is inverted, and the transistor MNS2 may be gated by the output signal nDN of the data inverter circuit SINV.

In embodiments, a flip-flop circuit 100 of FIG. 19 may further include reset transistors MPR and MNR as shown in FIG. 9.

Figure 20:
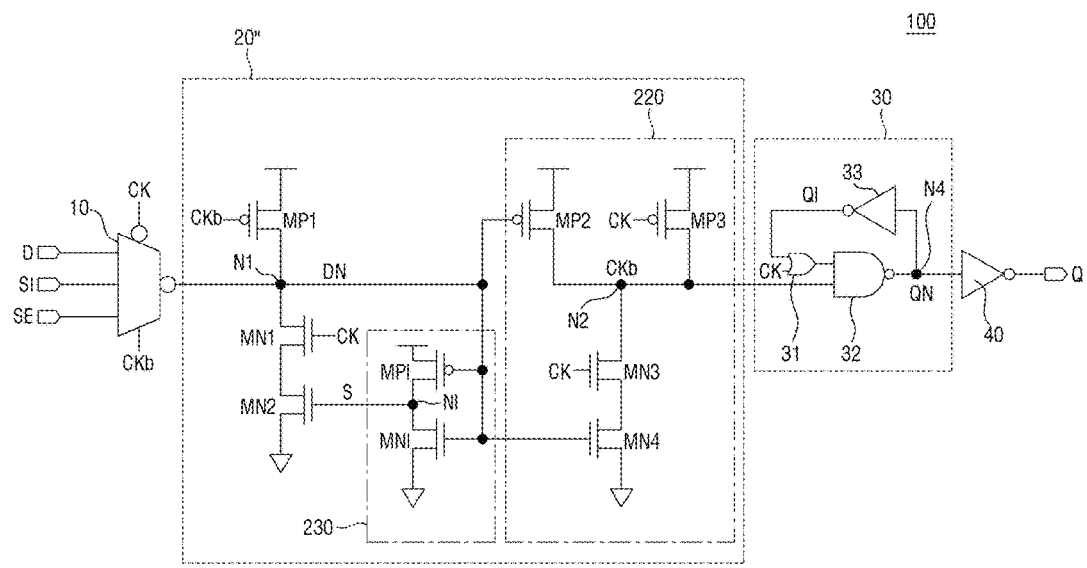
FIG. 20 is a circuit diagram illustrating a flip-flop circuit according to an embodiment.

FIG. 20 is a circuit diagram illustrating a flip-flop circuit according to some exemplary embodiments. For convenience of description, differences between the following exemplary embodiment and the above-described exemplary embodiments will be mainly described, and descriptions of the remaining elements will be the same.

Referring to FIG. 20, a first latch circuit 20" may further include an inverter circuit 230 between a node N1 and a gate of a transistor MN2. The inverter circuit 230 includes a transistor MPI and a transistor MNI. The node N1 is connected to an input terminal of the inverter circuit 230 and a gate of a transistor MN4, and the gate of the transistor MN2 may be connected to an output terminal NI of the inverter circuit 230.

Because the gate of the transistor MN4 of a NAND circuit 220, the input terminal of the inverter circuit 230, that is, a gate of the transistor MPI, and a gate of the transistor MNI are connected to the node N1, a signal S, which is obtained by inverting a signal DN of the node N1, may be applied to the gate of the transistor MN2.

Figure 21:
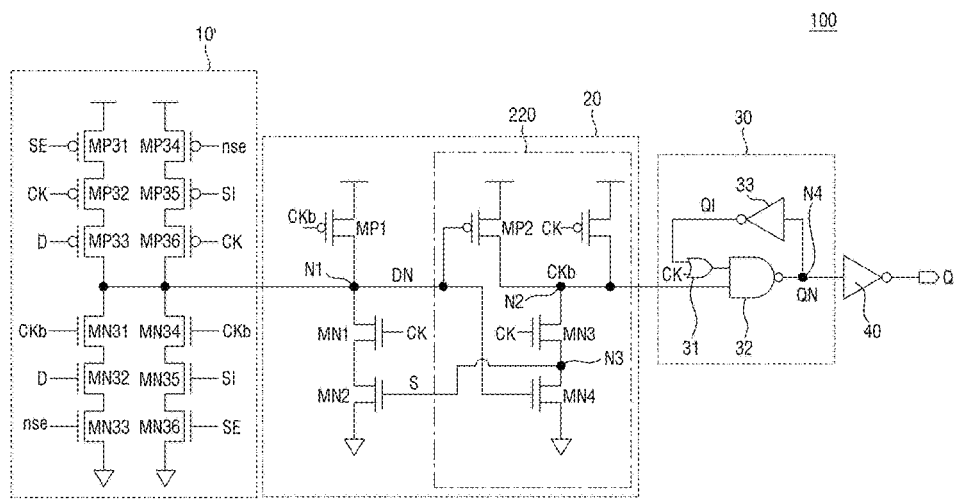
FIG. 21 is a circuit diagram illustrating a flip-flop circuit according to an embodiment.

FIG. 21 is a circuit diagram illustrating a flip-flop circuit according to some exemplary embodiments. For convenience of description, differences between the following exemplary embodiment and the above-described exemplary embodiments will be mainly described, and the description of the circuit configuration for the remaining components such as first latch circuit 20, second latch circuit 30, and output driver circuit 40 will be the same as those in the exemplary embodiment of FIG. 4.

Referring to FIG. 21, unlike in FIG. 4, a scan MUX circuit 10 may include six p-type transistors connected between the power supply terminal and a node N1, and six n-type transistors connected between the node N1 and the VSS terminal.

Specifically, in the scan MUX circuit 10, a plurality of p-type transistors MP31, MP32, and MP33 are connected in series between the power supply terminal and the node N1, and a plurality of p-type transistors MP34, MP35, and MP36 are connected in series between the power supply terminal and the node N1. That is, the p-type transistors MP31, MP32, and MP33 and the p-type transistors MP34, MP35, and MP36 are connected in parallel between the power supply terminal and the node N1.

Further, in the scan MUX circuit 10, a plurality of n-type transistors MN31, MN32, and MN33 are connected in series between the node N1 and the VSS terminal, and a plurality of n-type transistors MN34, MN35, and MN36 are connected in series between the node N1 and the VSS terminal. That is, the transistors MN31, MN32, and MN33 and the transistors MN34, MN35, and MN36 are connected in parallel between the node N1 and the VSS terminal.

The scan enable signal SE is applied to a gate of each of the transistor MP31 and the transistor MN36, and the clock signal CK is applied to a gate of each of the transistor MP32 and the transistor MP36. The data signal D is applied to a gate of each of the transistor MP33 and the transistor MN32, and the inverted scan enable signal nse is applied to a gate of each of the transistor MP34 and the transistor MN33. The clock buffer signal CKb is applied to a gate of each of the transistor MN31 and the transistor MN34.

In the scan MUX circuit 10 of the illustrated exemplary embodiment, when the clock signal CK is at a logic low level, the transistors MP32 and MP36 are turned on, and the transistors MN31 and MN34 are turned off, and thus when the scan enable signal SE is enabled, one of the scan input signal SI or the data signal D may be output to the node N1 in the same manner as the exemplary embodiment of FIG. 4.

Meanwhile, transistors MP1, MN1, and MN2 may operate as keeper transistors that keep an input signal of a flip-flop circuit 100 at the node N1, and the transistors MP36, MP32, MN31, and MN34 may operate as input control transistors that determine whether the flip-flop circuit 100 receives or does not receive a data input.

Figure 22:
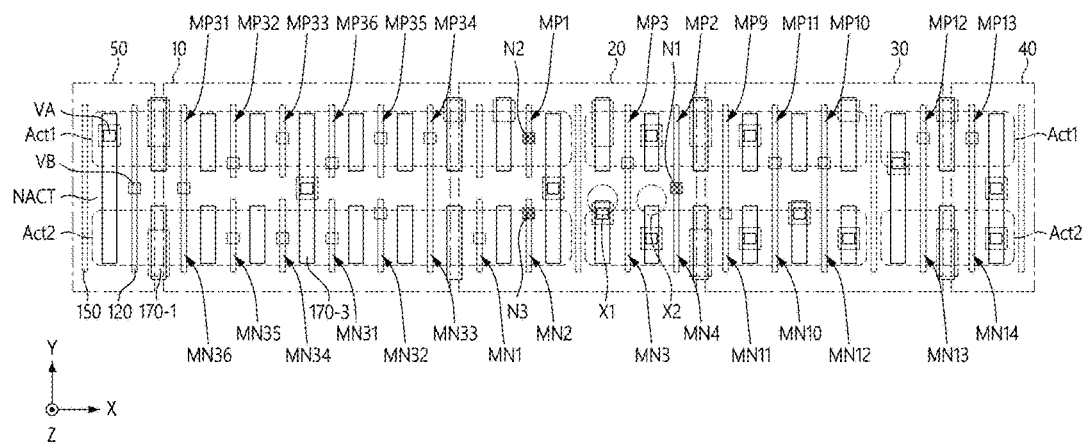
FIGS. 22 to 24 are top views for describing a layout of the flip-flop circuit of FIG. 21 according to an embodiment.
Figure 23:
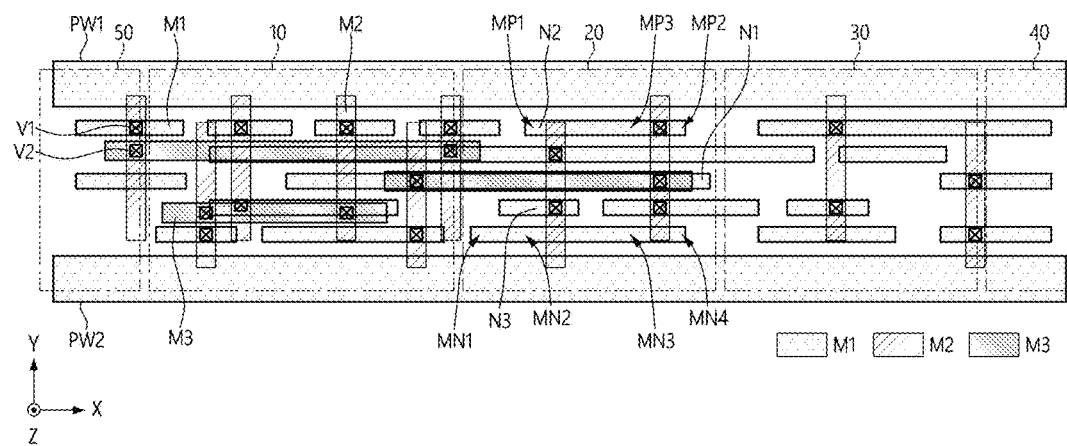
Figure 24:
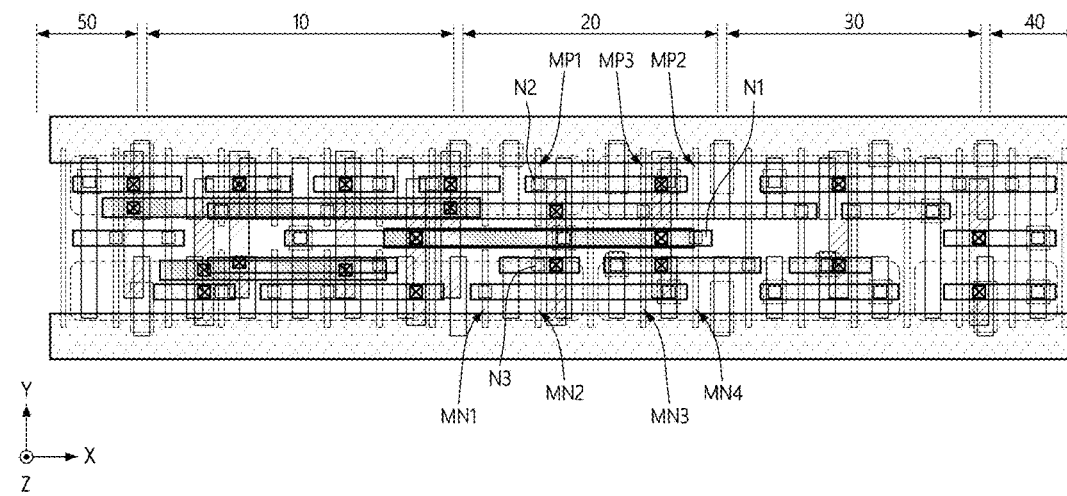

FIGS. 22 to 24 are top views for describing a layout of the flip-flop circuit of FIG. 21. For convenience of description, differences between the following layouts and the layouts of FIGS. 6 to 8 will be mainly described.

A flip-flop of FIGS. 22 to 24 is implemented in a single height layout unlike the flip-flop of FIGS. 6 to 8. FIG. 22 is a top view illustrating until a FEOL of the flip-flop circuit 100 of FIG. 21, FIG. 23 is a top view illustrating until a MOL, and FIG. 24 is a top view illustrating until a BEOL.

In a layout implemented in a single height layout, a plurality of functional circuits may be arranged in a Y direction between two power supply lines. In the illustrated example, the clock buffer circuit 50, the scan MUX circuit 10, the first latch circuit 20, the second latch circuit 30, and the output driver circuit 40 are sequentially arranged in an X direction between a supply power line PW1 and a ground power line PW2 that are spaced apart from each other in the Y direction.

When the first latch circuit 20 is described in detail with reference to FIG. 22, the node N1 is formed over a gate stack 120 of the transistor MN3 and a gate stack of the transistor MN4, a node N2 is formed over a gate stack of the transistor MP1, and a node N3 is formed over a gate stack of the transistor MN2.

When a description is made by matching FIG. 23 with FIG. 24, the node N1 is electrically connected while intersecting a first metal line M1, and the node N2 is electrically connected while intersecting the first metal line over the transistors MP1 to MP3. The node N3 is electrically connected to a source contact 170 of the transistor MN3, a drain contact 170 of the transistor MPT, and a gate contact of the transistor MN2 through the first metal line, the second metal line, and the third metal line.

That is, because the clock buffer signal CKb is provided to each of the scan MUX circuit 10, the transistor MP1, and the second latch circuit 30 through the node N2 (that is, the output node of the NAND circuit), PnR efficiency from the clock buffer circuit may be increased, and accordingly, the flip-flop circuit 100 may be more synchronized with an operating frequency of the clock by using the clock buffer signal generated internally during operation, thereby improving performance.

Figure 25:
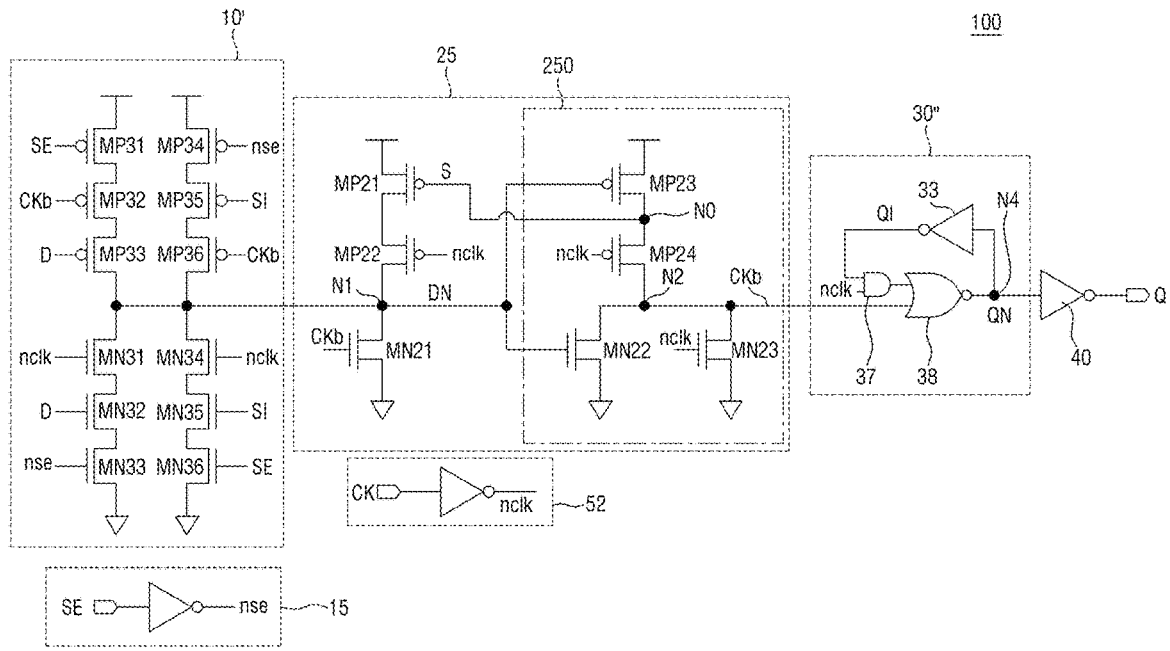
FIG. 25 is a circuit diagram illustrating a flip-flop circuit according to an embodiment.

FIG. 25 is a circuit diagram illustrating a flip-flop circuit according to some exemplary embodiments. For convenience of description, differences between the following exemplary embodiment and the above-described exemplary embodiments will be mainly described, and the description of the remaining components such as scan inverter circuit 15, first latch circuit 25, second latch circuit 30", and inverted clock generation circuit 52 will be the same as those in the exemplary embodiment of FIG. 10.

Referring to FIG. 25, a flip-flop circuit 100 may include a scan MUX circuit 10', a first latch circuit 25, a second latch circuit 30", and an output driver circuit 40.

The first latch circuit 25 may be implemented in the same manner as the first latch circuit 25 of FIG. 10, which includes the NOR circuit 250. In the scan MUX circuit 10', transistors are implemented in the same manner as those of the scan MUX circuit of FIG. 21, but due to the characteristics of the NOR circuit, the inverted clock signal nclk is input to a gate of each of transistors MN31 and MN34, and a node N2(signal CKb) is connected to a gate of each of transistors MP32 and MP36.

According to some exemplary embodiments, the second latch circuit 30" may include AOI circuit including AND circuit 37 and NOR circuit 38, and an inverter circuit 33.

Figure 26:
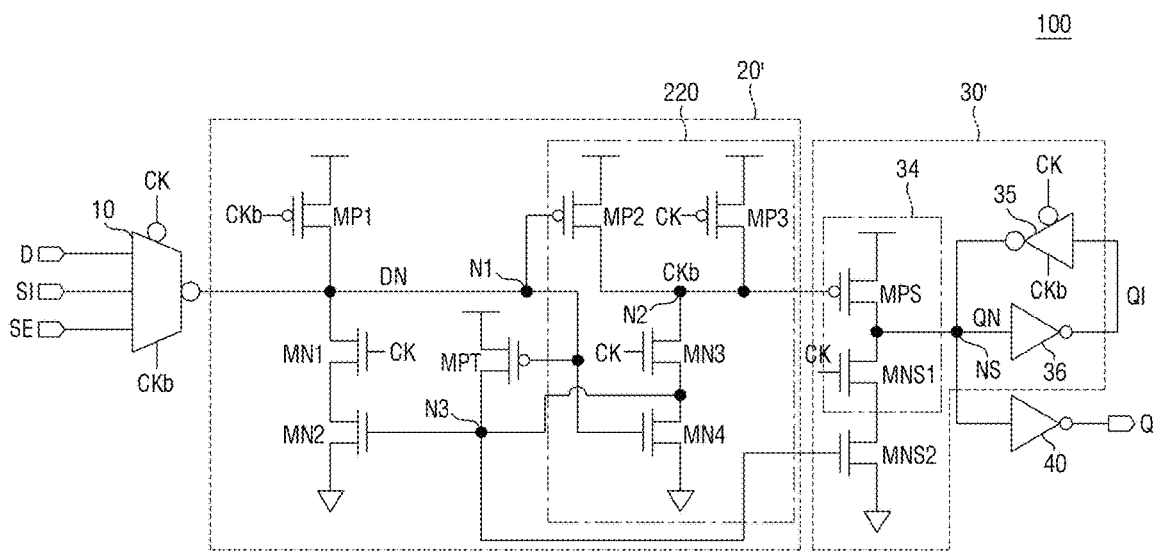
FIG. 26 is a circuit diagram illustrating a flip-flop circuit according to an embodiment.

FIG. 26 is a circuit diagram illustrating a flip-flop circuit according to some exemplary embodiments.

Referring to FIG. 26, a flip-flop circuit 100 may include a scan MUX circuit 10, a first latch circuit 20', a second latch circuit 30', and an output driver circuit 40. The scan MUX circuit 10 and the second latch circuit 30' are implemented in the same manner as the scan MUX circuit 10 of FIG. 3 or 4 and the second latch circuit 30' of FIG. 19, and thus descriptions thereof will be omitted.

The first latch circuit 20' may further include a transistor MPT. The transistor MPT is a p-type transistor connected between the power supply terminal and a node N3 and having a gate connected to a node N1. The transistor MPT is turned on/off in response to a signal DN of the node N1 so that a signal of the node N3 is changed, and accordingly, a transistor MN2 or MNS2, whose gate is connected to the node N3, is turned on/off.

That is, the transistor MPT and a transistor MN4 may act as an inverter circuit that receives and inverts the signal DN of the node N1 and outputs the inverted signal as a signal S through the node N3.

Further, the node N3 is connected to the gate terminal of the transistor MNS2 together with a drain terminal of the transistor MPT and a gate terminal of the transistor MN2 to operate as a terminal of the signal S input to the second latch circuit 30' so that a glitch may be prevented from occurring.

Figure 27:
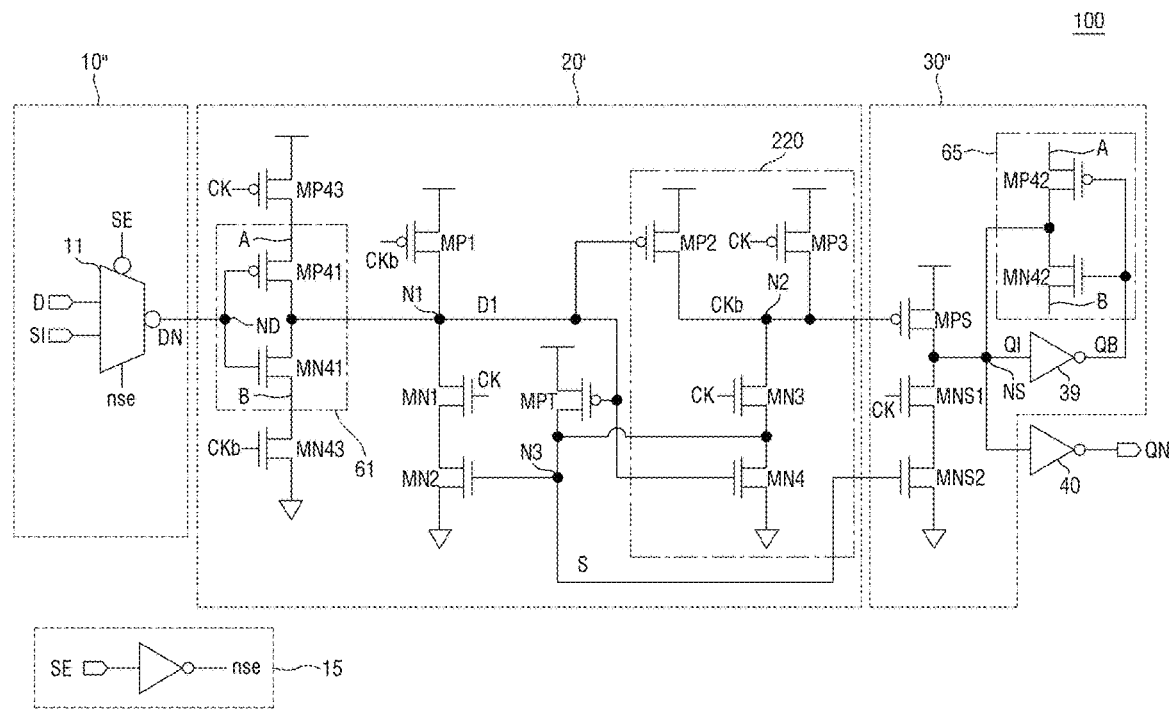
FIG. 27 is a circuit diagram illustrating a flip-flop circuit according to an embodiment.

FIG. 27 is a circuit diagram illustrating a flip-flop circuit according to some exemplary embodiments.

Referring to FIG. 27, a flip-flop circuit 100 may include a scan MUX circuit 10", a first latch circuit 20', a second latch circuit 30", and an output driver circuit 40. The first latch circuit 20' and the output driver circuit 40 are the same as those of FIG. 26, and thus descriptions thereof will be omitted.

The scan MUX circuit 10" includes a multiplexer 11 configured to select one of the data signal D and the scan input signal SI in response to the scan enable signal SE and the inverted scan enable signal, and transistors MP43, MP41, MN41, and MN43 connected in series between the power supply terminal and the VSS terminal.

The transistor MP41 and the transistor MN41 form an inverter circuit 61 to invert an output signal DN of the multiplexer 11. The inverter circuit 61 outputs the output signal DN to a node N1 according to the clock signal CK or the clock buffer signal CKb. A source terminal (node A) of the transistor MP41 is connected to a drain terminal of the transistor MP43, and a source terminal of the transistor MP43 is connected to the power supply terminal. A source terminal (node B) of the transistor MN41 is connected to a drain terminal of the transistor MN43, and a source terminal of the transistor MN43 is connected to the VSS terminal. The transistor MP43 is gated by the clock signal CK, and the transistor MN43 is gated by the clock buffer signal CKb of a node N2.

The second latch circuit 30" includes transistors MP5, MNS1, and MNS2 connected in series between the power supply terminal and the VSS terminal, an inverter circuit 65 connected between the node A and the node B, and an inverter circuit 39.

A gate of the transistor MPS is connected to the node N2, the clock signal CK is applied to a gate of the transistor MNS1, and the gate of the transistor MNS2 is connected to a node N3. The inverter circuit 65 is connected to each of the node A and the node B of inverter circuit 61 of the scan MUX circuit 10". That is, the inverter circuit 65 and the inverter circuit 61 share a modified power supply terminal (node A) and a modified power ground terminal (node B).

Figure 28:
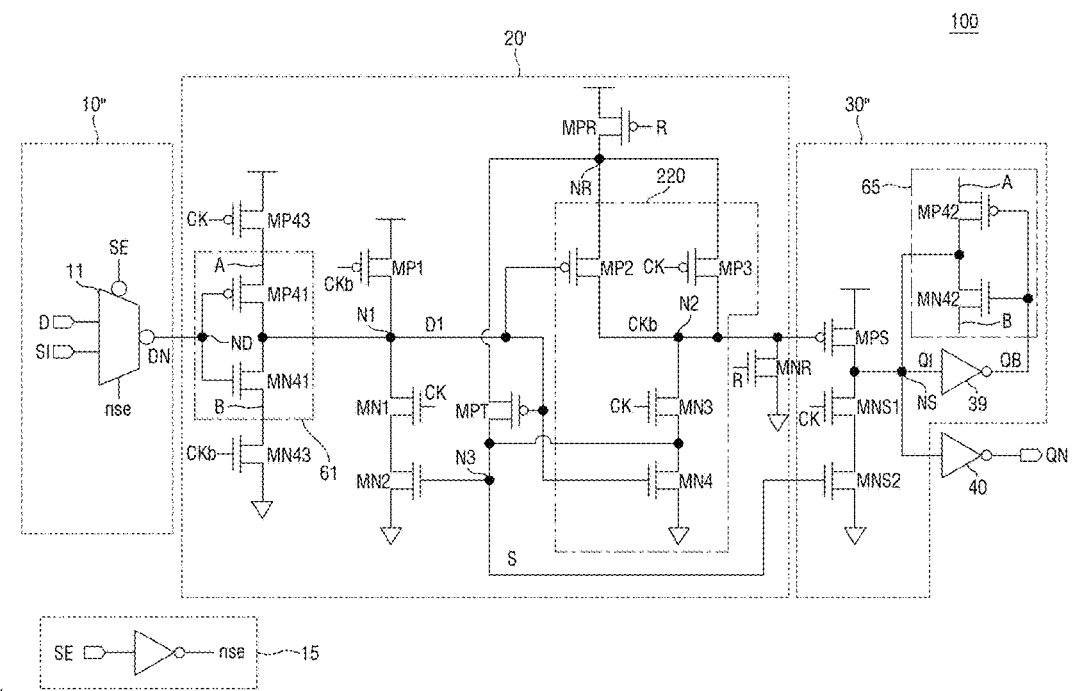
FIG. 28 is a circuit diagram illustrating a flip-flop circuit according to an embodiment.

FIG. 28 is a circuit diagram illustrating a flip-flop circuit according to some exemplary embodiments.

Referring to FIG. 28, a flip-flop circuit 100 may include a scan MUX circuit 10", a first latch circuit 20', a second latch circuit 30', and an output driver circuit 40. The scan MUX circuit 10", the second latch circuit 30', and the output driver circuit 40 are the same as those of FIG. 27, and thus descriptions thereof will be omitted.

The first latch circuit 20' further includes a reset transistor MPR and a reset transistor MNR. The reset transistor MPR is connected between the power supply terminal and a node NR and gated by the reset signal R, and the reset transistor MNR is connected between a node N2, which is an output terminal of the first latch circuit 20', and the VSS terminal and gated by the reset signal R.

A NAND circuit 220 is connected between the node NR and the VSS terminal. That is, source and drain terminals of a transistor MP2 and source and drain terminals of a transistor MP3 are connected in parallel between the node NR and the node N2.

A transistor MPT is connected between the node NR and a node N3 and gated by a signal of the node N1.

Figure 29:
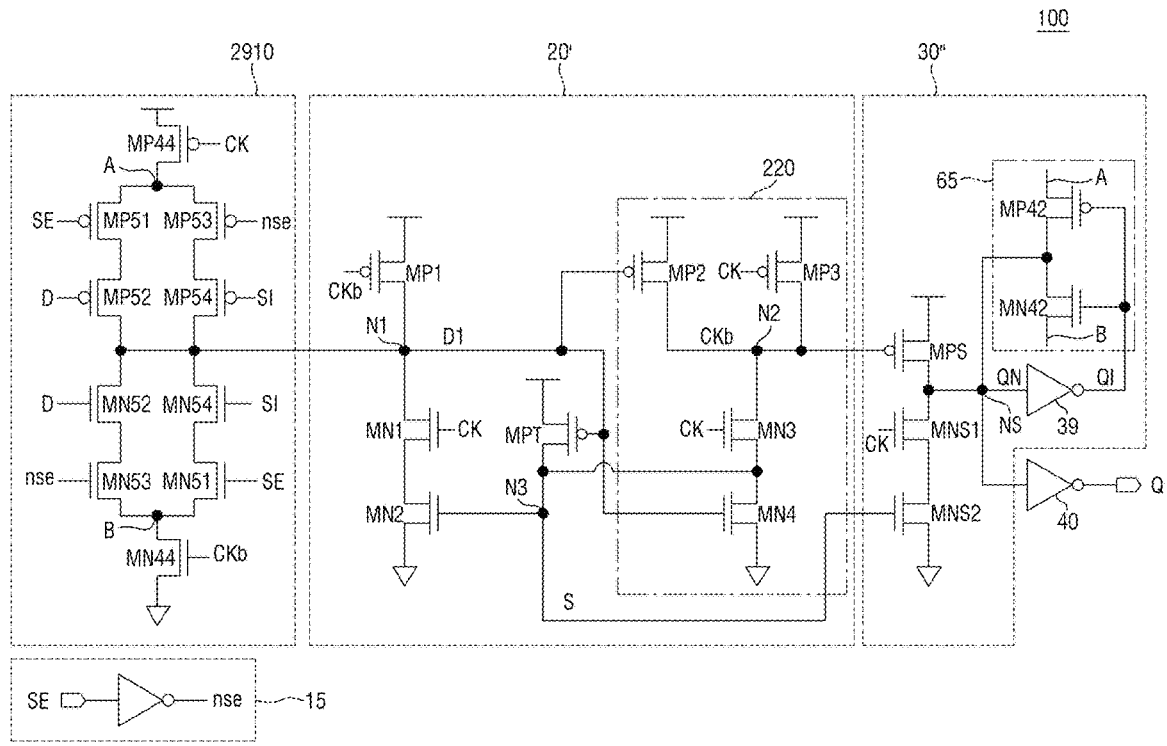
FIG. 29 is a circuit diagram illustrating a flip-flop circuit according to an embodiment.

FIG. 29 is a circuit diagram illustrating a flip-flop circuit according to some exemplary embodiments.

Referring to FIG. 29, a flip-flop circuit 100 may include a D flip-flop circuit 2910, a first latch circuit 20', a second latch circuit 30", and an output driver circuit 40. The first latch circuit 20', the second latch circuit 30", and the output driver circuit 40 are the same as those of FIG. 28, and thus descriptions thereof will be omitted.

The flip-flop circuit may not use the scan MUX circuit. That is, the flip-flop circuit may include the D flip-flop circuit 2910 at the front end of the first latch circuit 20'. The D flip-flop circuit 2910 includes a transistor MP44 connected between the power supply terminal and a node A, a transistor MP51 and a transistor MP52 that are connected in series between the node A and a node N1, and a transistor MP53 and a transistor MP54 that are connected in series between the node A and that node N1 and connected in parallel with the transistor MP51 and the transistor MP52. In addition, the D flip-flop circuit 2910 may include a transistor MN52 and s transistor MN53 connected in series between the node N1 and a node B, a transistor MN54 and a transistor MN 51 that are connected in series between the node N1 and the node B and connected in parallel with the transistor MN52 and the transistor MN53, and a transistor MN44 connected between the node B and the VSS terminal. The transistor MP51 and the transistor MN51 may be gated by the scan enable signal SE, the transistor MP52 and the transistor MN52 may be gated by the data signal D, the transistor MP53 and the transistor MN53 may be gated by the inverted scan enable signal nse, and the transistor MP54 and the transistor MN54 may be gated by the scan input signal SI. In addition, the transistor MP44 may be gated by the clock signal CK, and the transistor MN44 may be gated by the clock buffer signal CKb.

In the flip-flop circuit of FIG. 29, the D flip-flop circuit 2910 may input data to the first latch circuit 20' on the basis of data, a scan input signal, a scan enable signal, and a clock signal using a smaller number of transistors than the scan MUX circuit.

Figure 30:
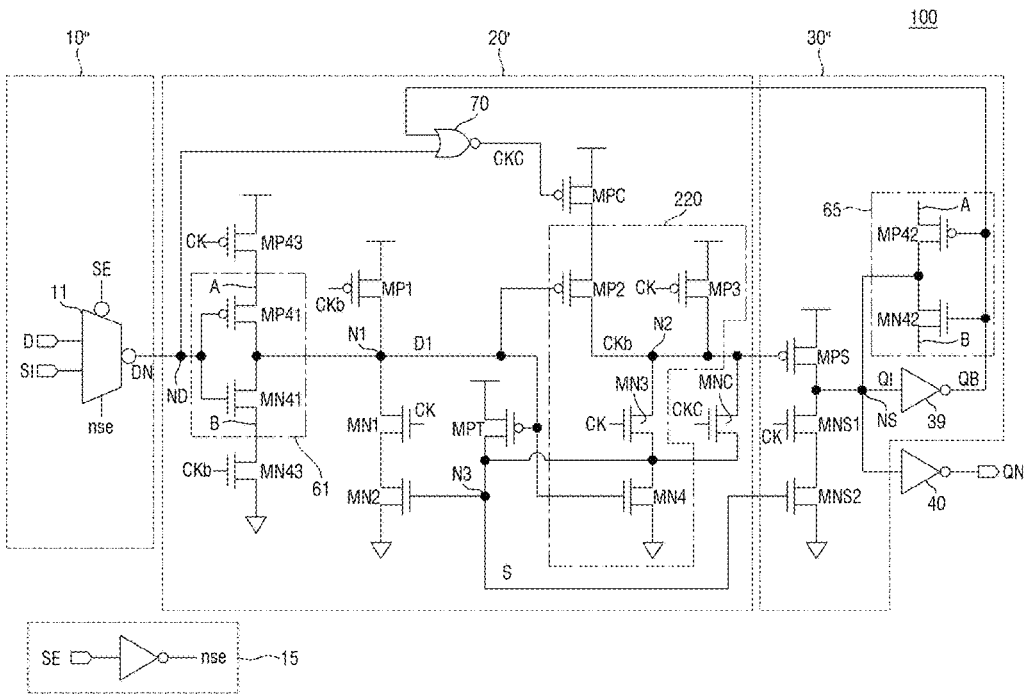
FIG. 30 is a circuit diagram illustrating a flip-flop circuit according to an embodiment.

FIG. 30 is a circuit diagram illustrating a flip-flop circuit according to some exemplary embodiments.

Referring to FIG. 30, the flip-flop circuit 100 may include a scan MUX circuit 10", a first latch circuit 20', a second latch circuit 30", and an output driver circuit 40. A flip-flop circuit 100 of FIG. 30 may further include a NOR circuit 70 in first latch circuit 20'. The first latch circuit 20', the second latch circuit 30", and the output driver circuit 40 are the same as those of FIG. 24, and thus descriptions thereof will be omitted.

The scan MUX circuit 10" includes transistors MP43, MP41, MN41, and MN43 connected in series between the power supply terminal and the VSS terminal.

The transistor MP43 is connected between the power supply terminal and a node A and includes a gate to which the clock signal CK is applied. The transistor MP41 and the transistor MN41 form an inverter circuit 61 to invert an output signal DN of the multiplexer 11. The inverter circuit 61 outputs the output signal DN to a node N1 according to the clock signal CK or the clock buffer signal CKb. A source terminal (node A) of the transistor MP41 is connected to a drain terminal of the transistor MP43, and a source terminal of the transistor MP43 is connected to the power supply terminal. A source terminal (node B) of the transistor MN41 is connected to a drain terminal of the transistor MN43, and a source terminal of the transistor MN43 is connected to the VSS terminal. The transistor MP43 is gated by the clock signal CK, and the transistor MN43 is gated by the clock buffer signal CKb of a node N2.

A transistor MPT and a transistor MN3, whose drain terminals are connected to a node N3, may act as an inverter, which receives a signal of the node N1 and outputs the inverted signal to the node N3, together with a transistor MN4 instead of the data inverter circuit SINV of FIG. 16. That is, the number of transistors may be reduced more than the data inverter circuit SINV of FIG. 16.

Further, in an inverter circuit 65 of the second latch circuit 30", a source terminal of a transistor MP42 is connected to the node A, a source terminal of a transistor MN42 is connected to the node B, and the number of transistors for receiving the clock signal CK in the second latch circuit 30" is reduced so that the dependence on a toggling slope of the clock signal may be reduced. That is, it is possible to operate more efficiently even at a low voltage.

The NAND circuit 220 may include a transistor MPC and a transistor MP2 connected in series between the power supply terminal and a node N2, a transistor MP3 connected between the power supply terminal and the node N2, and a transistor MN3 and a transistor MN4 connected in series between the node N2 and the VSS terminal. A gate of the transistor MPC is connected to an output terminal of the NOR circuit 70 and is turned on/off in response to a signal CKC.

The transistor MN3 is connected between the node N2 and the node N3, and the transistor MN4 is connected between the node N3 and the VSS terminal. A gate of each of the transistor MP2 and the transistor MN4 is connected to the node N1, and the clock signal CK may be supplied to a gate of each of the transistor MP3 and the transistor MN3.

The first latch circuit 20' may further include a transistor MPT. The transistor MPT is a p-type transistor connected between the power supply terminal and the node N3 and having a gate connected to the node N1.

The NOR circuit 70 receives a signal of a node ND and an output signal QB of the inverter circuit 39 and outputs the signal CKC. An output signal DN of a multiplexer 11, which is configured to select one of the data signal D and the scan input signal SI according to the scan enable signal SE and the inverted enable signal nse, is output to the node ND.

That is, an inverted output signal QB of the second latch circuit 30" and the inverted input signal DN of the first latch circuit 20' are compared, and only when the two signals are different, the signal CKC gates the transistor MPC and a transistor MNC to operate the NAND circuit 220 so that a signal of the node N2 may be latched to a node NS.

That is, the case in which the two signals QB and DN are the same is a case in which the flip-flop circuit 100 is not required to operate so that unnecessary power consumption due to toggling of the clock signal may be reduced.

Figure 31:
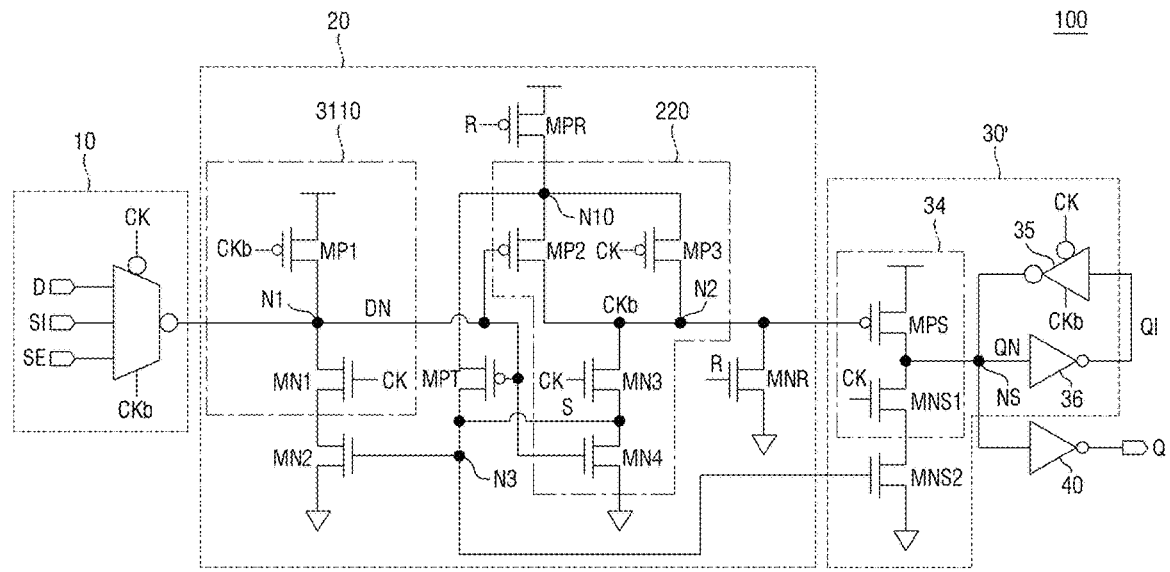
FIG. 31 is a circuit diagram illustrating a flip-flop circuit according to an embodiment.

FIG. 31 is a circuit diagram illustrating a flip-flop circuit according to some exemplary embodiments.

The first latch circuit 20 may include an inverter circuit 3110 and a transistor MN2 connected in series between the power supply terminal and the VSS terminal, and a NAND circuit 220 configured to receive an output signal of the inverter circuit 3110 and the clock signal CK. For example, the inverter circuit 3110 may include a transistor MP1 and a transistor MN1, and the transistor MN2 may be connected in series between a source terminal of the transistor MN1 and the VSS terminal and may have a gate connected to a node N3.

A gate of the transistor MP1 is connected to a node N1, the clock signal CK is supplied to a gate of the transistor MN1, and the gate of the transistor MN2 is connected to the node N3. The transistor MP1, the transistor MN2, and the transistor MN1 receive an output signal of the scan MUX circuit 10 and store the output signal at the node N1 according to the clock signal CK, the clock buffer signal CKb, and a signal S.

The transistor MN3 is connected between the node N2 and the node N3, and the transistor MN4 is connected between the node N3 and the VSS terminal. A gate of each of the transistor MP2 and the transistor MN4 is connected to the node N1, and the clock signal CK may be supplied to a gate of each of the transistor MP3 and the transistor MN3.

The first latch circuit 20 may further include a transistor MPT. The transistor MPT is a p-type transistor connected between a node N10 and a node N3 and having a gate connected to a node N1.

A NAND circuit 220 included in the first latch circuit 20 is connected between the node N10 and the VSS terminal and performs a NAND operation on a signal of the node N1 and the clock signal and outputs the operation result to a node N2.

The node N3 is connected to a source terminal of a transistor MN3, a gate terminal of a transistor MN2, and a gate terminal of a transistor MNS2. The node N10 is connected to a drain terminal of a reset transistor MPR, a source terminal of a transistor MP2, and a source terminal of a transistor MP3.

The transistor MPT is turned on/off in response to a signal DN of the node N1 so that a signal of the node N3 is changed, and accordingly, the transistor MN2 or MNS2, whose gate is connected to the node N3, is turned on/off. Accordingly, charge leakage of a transistor MN1 or MNS1 may be prevented from occurring.

The first latch circuit 20 further includes the reset transistor MPR and a reset transistor MNR. The reset transistor MPR is connected between the power supply terminal and the node N10 and gated by a reset signal, and the reset transistor MNR is connected between the node N2 and the VSS terminal and gated by the reset signal.

Figure 32:
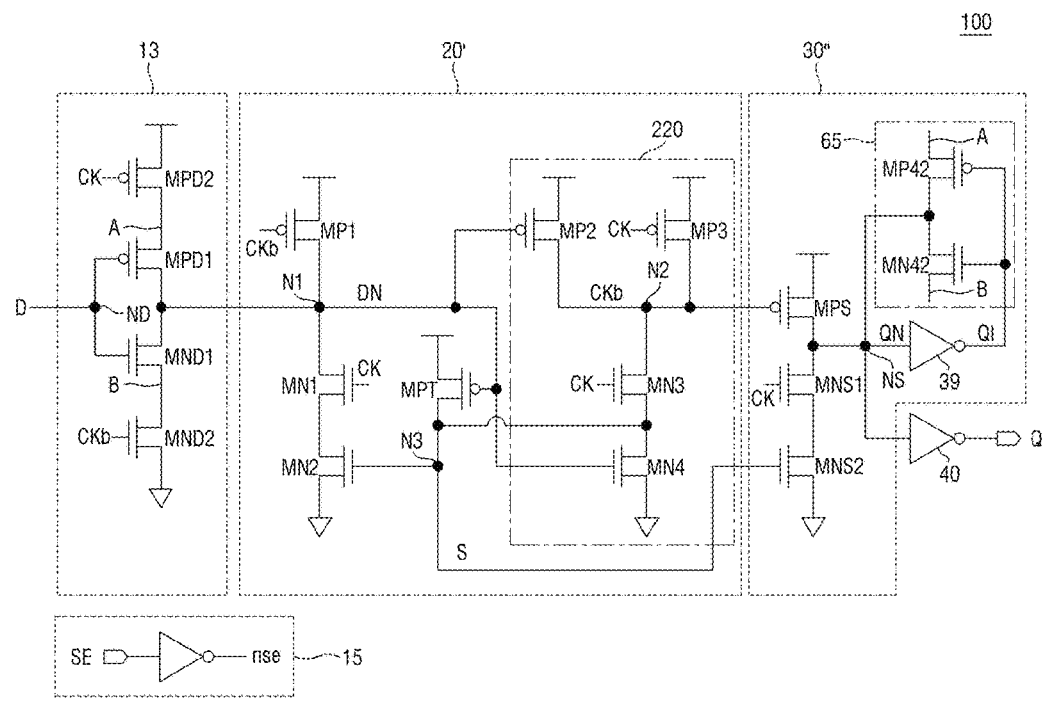
FIG. 32 is a circuit diagram illustrating a flip-flop circuit according to an embodiment.

FIG. 32 is a circuit diagram illustrating a flip-flop circuit according to some exemplary embodiments.

Referring to FIG. 32, a flip-flop circuit 100 may include an input circuit 13, a first latch circuit 20', a second latch circuit 30", and an output driver circuit 40. Hereinafter, the difference between the input circuit 13 of the present exemplary embodiment and the scan MUX circuit 10 of FIG. 31 will be mainly described.

The input circuit 13 may include a transistor MPD2, a transistor MND2 and an inverter including transistor MPD1 and transistor MND1, the inverter is connected between node A and node B. The node A is a drain terminal of the transistor MPD2 and the node B is a drain terminal of the transistor MND2. The input circuit 13 is more simply implemented than other embodiments, for example, using smaller number of transistor for input of the first latch circuit 20'.

The inverter may output from node ND to node N1 when the transistor MPD2 turns on according to a clock signals CK or the transistor MND2 turns on according to a signal CKb. That is, the inverter inverts a data signal D of the node ND to a signal DN of the node N1.

Figure 33:
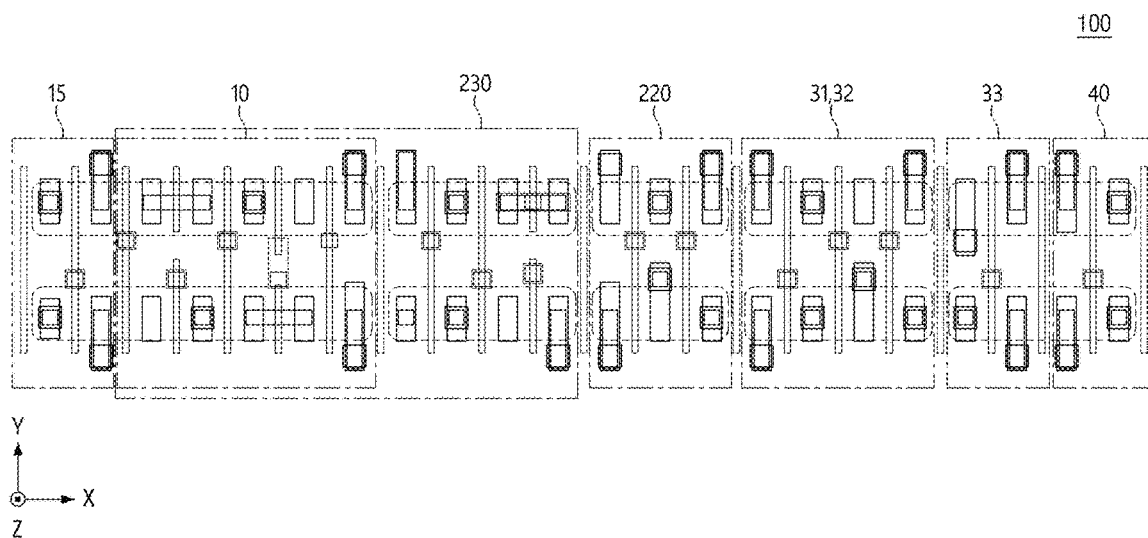
FIGS. 33 to 35 are top views for describing a layout of a flip-flop circuit according to an embodiment.
Figure 34:
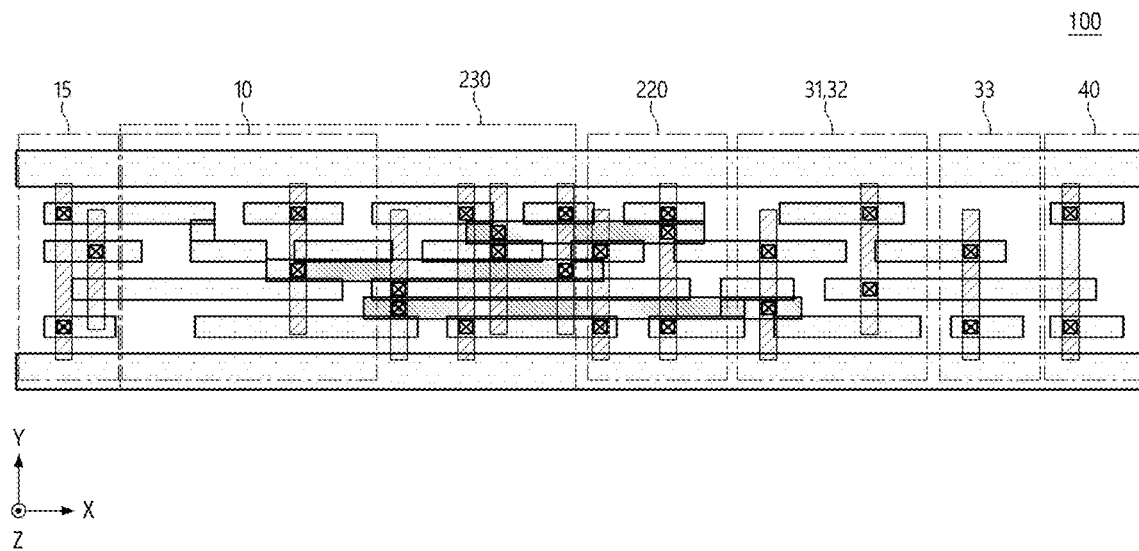
Figure 35:
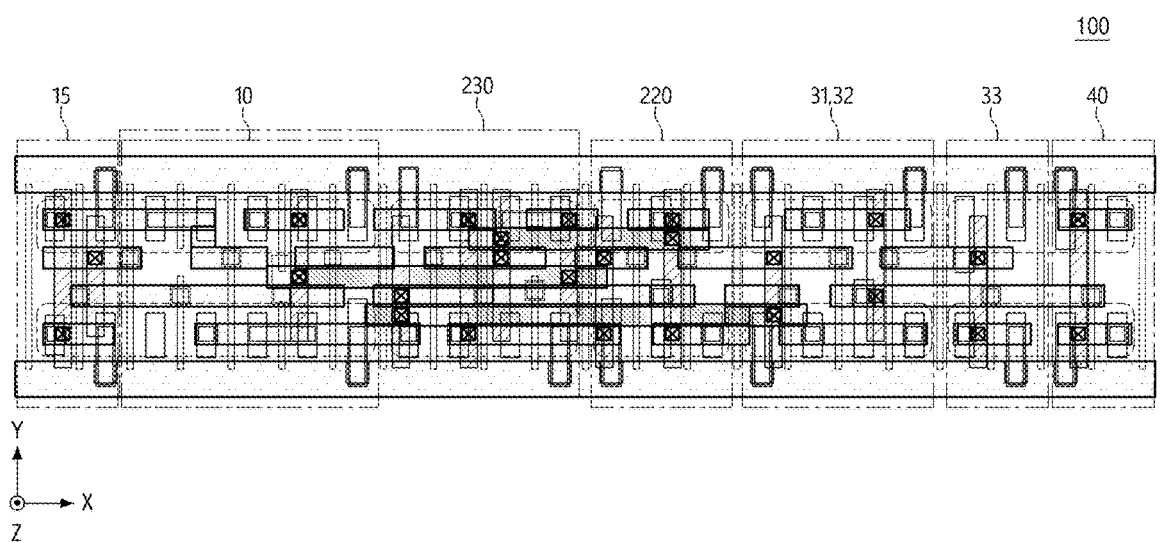

FIGS. 33 to 35 are top views for describing a layout of a flip-flop circuit according to some exemplary embodiments. FIG. 33 is a top view illustrating until a FEOL of a flip-flop circuit 100 according to some exemplary embodiments, FIG. 34 is a top view illustrating until a MOL, and FIG. 35 is a top view illustrating until a BEOL. For convenience of description, only differences in the arrangement of each of the functional circuits with those of FIGS. 6 to 8 will be described, and descriptions overlapping with those of FIGS. 6 to 8 will be omitted.

According to the exemplary embodiment shown in FIGS. 33 to 35, the flip-flop circuit may be implemented in a single height layout. The illustrated layout shows the flip-flop circuit of FIG. 4. The scan inverter circuit 15, the scan MUX circuit 10, the inverter circuit 230 of the first latch circuit, the NAND circuit 220, the OAI circuit including OR circuit 31 and NAND circuit 32 of the second latch circuit, the inverter circuit 33, and the output driver circuit 40 may be sequentially arranged from left to right.

Although the exemplary embodiments of the present disclosure have been described above with reference to the accompanying drawings, the present disclosure is not limited thereto and may be embodied in various different forms. It will be understood by those of ordinary skill in the art that the present disclosure may be implemented in other specific forms without departing from the technical spirit or essential features of the present disclosure. Accordingly, the exemplary embodiments set forth herein should be considered only as examples and not for purposes of limitation.

What is claimed is:

1. A master latch circuit comprising:
a first p-type transistor, a first n-type transistor, and a second n-type transistor connected in series between a power supply terminal and a power ground terminal;
a first node connected to a drain terminal of the first p-type transistor and a drain terminal of the first n-type transistor; and
a NAND circuit configured to receive a signal of the first node and a clock signal, perform a NAND operation, and output a result of the NAND operation to a second node,
wherein the NAND circuit includes a second p-type transistor connected in parallel with a third p-type transistor between the power supply terminal and the second node, and a third n-type transistor connected in series with a fourth n-type transistor between the second node and the power ground terminal,
wherein a gate of the second p-type transistor and a gate of the fourth n-type transistor are connected to the first node,
wherein a gate of the first n-type transistor, a gate of the third p-type transistor, and a gate of the third n-type transistor are configured to receive the clock signal, and
wherein a gate of the first p-type transistor is connected to the second node.

2. The master latch circuit of claim 1, wherein a third node is connected to the third n-type transistor, the fourth n-type transistor, and a gate of the second n-type transistor.

3. The master latch circuit of claim 1, wherein the master latch circuit is connected to a scan multiplexer (MUX) circuit configured to output a data signal or a scan input signal to the first node according to a scan enable signal, the clock signal, and a signal of the second node,
wherein the scan MUX circuit includes a first inverter circuit having an output terminal connected to the first node and configured to output the data signal or the scan input signal according to the clock signal or the signal of the second node, a fourth p-type transistor and a fifth p-type transistor connected in series between a first end of the first inverter circuit and the power supply terminal, a sixth p-type transistor and a seventh p-type transistor connected in series between the first end of the first inverter circuit and the power supply terminal, an eighth n-type transistor and a fifth n-type transistor connected in series between a second end of the first inverter circuit and the power ground terminal, and a sixth n-type transistor and a seventh n-type transistor connected in series between the second end of the first inverter circuit and the power ground terminal,
wherein a gate of the fourth p-type transistor and a gate of the sixth n-type transistor are configured to receive the scan enable signal,
wherein a gate of the fifth p-type transistor and a gate of the fifth n-type transistor are configured to receive the data signal,
wherein a gate of the sixth p-type transistor and a gate of the eighth n-type transistor are configured to receive an inverted scan enable signal, and
wherein a gate of seventh p-type transistor and a gate of the seventh n-type transistor are configured to receive the scan input signal.

4. The master latch circuit of claim 1, wherein an output of the master latch circuit is provided to a slave latch circuit, and
wherein the slave latch circuit includes an OR/AND/Inverter (OAI) circuit configured to store and output a signal of the second node in response to the clock signal.

5. The master latch circuit of claim 4, wherein the slave latch circuit further includes a second inverter circuit configured to invert an output signal of the OAI circuit and provide the inverted output signal to the OAI circuit.

6. The master latch circuit of claim 1, further comprising:
a p-type reset transistor connected between the power supply terminal and a source terminal of the second p-type transistor, wherein a gate of the p-type reset transistor is configured to receive a reset signal; and
an n-type reset transistor connected between the second node and the power ground terminal, wherein a gate of the n-type reset transistor is configured to receive the reset signal.

7. The master latch circuit of claim 4, wherein the OAI circuit includes:
a ninth p-type transistor, a ninth n-type transistor, and a tenth n-type transistor connected in series between the power supply terminal and the power ground terminal;
a fourth node connected to a drain terminal of the ninth p-type transistor and a drain terminal of the ninth n-type transistor;
a fifth node connected to a source terminal of the ninth n-type transistor and a drain terminal of the tenth n-type transistor;
a tenth p-type transistor connected in series with an eleventh p-type transistor between the power supply terminal and the fourth node;
an eleventh n-type transistor connected between the fourth node and the fifth node; and
a third inverter circuit configured to invert a signal of the fourth node and input the inverted signal of the fourth node to a gate of each of the tenth p-type transistor and the eleventh n-type transistor,
wherein a gate of the ninth p-type transistor is connected to the second node, and
wherein a gate of the eleventh p-type transistor and a gate of the ninth n-type transistor are configured to receive the clock signal.

8. The master latch circuit of claim 7, wherein the gate of the ninth p-type transistor and a gate of the tenth n-type transistor are connected to the second node.

9. The master latch circuit of claim 7, further comprising a fourth inverter circuit configured to invert the signal of the first node, and
wherein a gate of the tenth n-type transistor is connected to an output terminal of the fourth inverter circuit.

10. The master latch circuit of claim 1, further comprising a fifth inverter circuit configured to invert the signal of the first node and input the inverted signal of the first node to a gate of the second n-type transistor.

11. A flip-flop circuit comprising:
a scan multiplexer (MUX) circuit having a MUX output terminal connected to a first node;
a first latch circuit connected between the first node and a second node;
a second latch circuit connected between the second node and a third node; and
an output driving circuit configured to drive and output a signal of the third node,
wherein the first latch circuit includes a first p-type transistor, a first n-type transistor, and a second n-type transistor connected in series between a power supply terminal and a power ground terminal, and a NAND circuit configured to receive a signal of the first node and a clock signal, and perform a NAND operation and output a result of the NAND operation to the second node,
wherein the NAND circuit includes a second p-type transistor connected in parallel with a third p-type transistor between the power supply terminal and the second node, and a third n-type transistor connected in series with a fourth n-type transistor between the second node and the power ground terminal,
wherein a drain terminal of the first p-type transistor and a drain terminal of the first n-type transistor are connected to the first node,
wherein a gate of the second p-type transistor and a gate of the fourth n-type transistor are connected to the first node,
wherein a gate of the first n-type transistor, a gate of the third p-type transistor, and a gate of the third n-type transistor are configured to receive the clock signal,
wherein the first n-type transistor and the second n-type transistor are not simultaneously turned on, and
wherein a gate of the first p-type transistor is connected to the second node.

12. The flip-flop circuit of claim 11, wherein a fourth node is connected to the third n-type transistor, the fourth n-type transistor, and a gate of the second n-type transistor.

13. The flip-flop circuit of claim 11, wherein the scan MUX circuit includes:
a first inverter circuit having an inverter output terminal connected to the first node and configured to output a data signal or a scan input signal according to the clock signal or a signal of the second node;
a fourth p-type transistor connected in series with a fifth p-type transistor between a first end of the first inverter circuit and the power supply terminal;
a sixth p-type transistor connected in series with a seventh p-type transistor between the first end of the first inverter circuit and the power supply terminal;
a fifth n-type transistor connected in series with a sixth n-type transistor between a second end of the first inverter circuit and the power ground terminal; and
a seventh n-type transistor connected in series with an eighth n-type transistor between the second end of the first inverter circuit and the power ground terminal,
wherein a gate of the fourth p-type transistor and a gate of the seventh n-type transistor are configured to receive a scan enable signal,
wherein a gate of the fifth p-type transistor and a gate of the sixth n-type transistor are configured to receive the data signal,
wherein a gate of the sixth p-type transistor and a gate of the fifth n-type transistor are configured to receive an inverted scan enable signal, and
wherein a gate of the seventh p-type transistor and a gate of the eighth n-type transistor are configured to receive the scan input signal.

14. The flip-flop circuit of claim 11, further comprising:
a p-type reset transistor connected between the power supply terminal and a source terminal of the second p-type transistor, wherein a gate of the p-type reset transistor is configured to receive a reset signal; and
an n-type reset transistor connected between the second node and the power ground terminal, wherein a gate of the n-type reset transistor is configured to receive the reset signal.

15. The flip-flop circuit of claim 13, wherein the second latch circuit includes:
a ninth p-type transistor, a ninth n-type transistor, and a tenth n-type transistor connected in series between the power supply terminal and the power ground terminal;
the third node connected to a drain terminal of the ninth p-type transistor and a drain terminal of the ninth n-type transistor;
a fifth node connected to a source terminal of the ninth n-type transistor and a drain terminal of the tenth n-type transistor;
a tenth p-type transistor and an eleventh p-type transistor connected in series between the power supply terminal and the third node;
an eleventh n-type transistor connected between the third node and the fifth node; and
a third inverter circuit configured to invert a signal of the third node and input the inverted signal of the third node to a gate of each of the tenth p-type transistor and the eleventh n-type transistor,
wherein a gate of the ninth p-type transistor is connected to the second node, and
wherein a gate of the eleventh p-type transistor and a gate of the ninth n-type transistor are configured to receive the clock signal.

16. The flip-flop circuit of claim 13, wherein the NAND circuit further includes a fourth inverter circuit configured to invert the signal of the first node and provide the inverted signal of the first node to a gate of a tenth n-type transistor.

* * * * *